(12) United States Patent
Huo et al.

(10) Patent No.: US 11,508,745 B2
(45) Date of Patent: Nov. 22, 2022

(54) THREE-DIMENSIONAL MEMORY DEVICE HAVING A SHIELDING LAYER AND METHOD FOR FORMING THE SAME

(71) Applicant: YANGTZE MEMORY TECHNOLOGIES CO., LTD., Wuhan (CN)

(72) Inventors: Zongliang Huo, Wuhan (CN); Li Hong Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 97 days.

(21) Appl. No.: 16/940,393

(22) Filed: Jul. 28, 2020

(65) Prior Publication Data
US 2020/0357812 A1    Nov. 12, 2020

Related U.S. Application Data

(60) Division of application No. 16/140,422, filed on Sep. 24, 2018, now Pat. No. 10,763,274, which is a
(Continued)

(51) Int. Cl.
*H01L 27/1157* (2017.01)
*H01L 27/11573* (2017.01)
(Continued)

(52) U.S. Cl.
CPC ........ *H01L 27/11573* (2013.01); *G11C 5/06* (2013.01); *H01L 27/1157* (2013.01); *H01L 27/11582* (2013.01); *G11C 16/06* (2013.01)

(58) Field of Classification Search
CPC .......... H01L 27/11573; H01L 27/1157; H01L 27/11582; G11C 5/06; G11C 16/06
(Continued)

(56) References Cited

U.S. PATENT DOCUMENTS

2011/0215394 A1    9/2011  Komori et al.
2011/0220987 A1*   9/2011  Tanaka ............. H01L 27/11578
                                                      257/324
(Continued)

FOREIGN PATENT DOCUMENTS

CN          1497728 A      5/2004
CN        101711413 A      5/2010
(Continued)

OTHER PUBLICATIONS

International Search Report issued in corresponding International Application No. PCT/CN2018/093670, dated Mar. 27, 2019, 4 pages.
(Continued)

*Primary Examiner* — Dzung Tran
(74) *Attorney, Agent, or Firm* — Bayes PLLC

(57) ABSTRACT

Embodiments of three-dimensional (3D) memory devices having a shielding layer and methods for forming the 3D memory devices are disclosed. In an example, a method for forming a 3D memory device is disclosed. A peripheral device is formed on a substrate. A first interconnect layer including a first plurality of interconnects is formed above the peripheral device. A shielding layer including a conduction region is formed above the first interconnect layer. A second interconnect layer including a second plurality of interconnects is formed above the shielding layer. The conduction region of the shielding layer covers an area of the first and second plurality of interconnects in the first and second interconnect layers. A plurality of memory strings each extending vertically above the second interconnect layer are formed.

20 Claims, 15 Drawing Sheets

Related U.S. Application Data continuation of application No. PCT/CN2018/093670, filed on Jun. 29, 2018.

(51) Int. Cl.
*G11C 5/06* (2006.01)
*H01L 27/11582* (2017.01)
*G11C 16/06* (2006.01)

(58) Field of Classification Search
USPC .......................................................... 257/324
See application file for complete search history.

(56) References Cited

U.S. PATENT DOCUMENTS

| | | |
|---|---|---|
| 2012/0062777 A1 | 3/2012 | Kobayashi et al. |
| 2014/0061751 A1* | 3/2014 | Nakajima ............. H01L 27/088 257/314 |
| 2014/0211566 A1 | 7/2014 | Kono |
| 2014/0225235 A1 | 8/2014 | Du |
| 2014/0284713 A1 | 9/2014 | Kutsukake et al. |
| 2015/0037200 A1 | 2/2015 | Crawford et al. |
| 2015/0129878 A1 | 5/2015 | Shin et al. |
| 2015/0325588 A1* | 11/2015 | Lee .................... H01L 27/11568 257/329 |
| 2015/0372000 A1* | 12/2015 | Jee .................... H01L 27/11521 257/314 |
| 2015/0372005 A1* | 12/2015 | Yon .................... H01L 27/11582 257/5 |
| 2016/0027504 A1 | 1/2016 | Lee |
| 2016/0118128 A1 | 4/2016 | Hsiung et al. |
| 2016/0307632 A1* | 10/2016 | Lee .................... H01L 27/1157 |
| 2017/0221832 A1 | 8/2017 | Park et al. |
| 2017/0278806 A1 | 9/2017 | Kuo et al. |
| 2017/0330887 A1 | 11/2017 | Kim et al. |

FOREIGN PATENT DOCUMENTS

| | | |
|---|---|---|
| CN | 104981899 A | 10/2015 |
| CN | 105047649 A | 11/2015 |
| CN | 107221527 A | 9/2017 |
| CN | 109564923 A | 4/2019 |

OTHER PUBLICATIONS

Written Opinion of the International Searching Authority issued in corresponding International Application No. PCT/CN2018/093670, dated Mar. 27, 2019, 5 pages.

\* cited by examiner

THREE-DIMENSIONAL MEMORY DEVICE HAVING A SHIELDING LAYER AND METHOD FOR FORMING THE SAME

CROSS REFERENCE TO RELATED APPLICATION

This application is a division of U.S. application Ser. No. 16/140,422, filed on Sep. 24, 2018, entitled "THREE-DIMENSIONAL MEMORY DEVICE HAVING A SHIELDING LAYER AND METHOD FOR FORMING THE SAME," which is a continuation of International Application No. PCT/CN2018/093670, filed on Jun. 29, 2018, entitled "THREE-DIMENSIONAL MEMORY DEVICE HAVING A SHIELDING LAYER AND METHOD FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory device having a shielding layer and fabrication methods thereof are disclosed herein.

In one example, a 3D memory device includes a substrate, a peripheral device disposed on the substrate, a semiconductor layer disposed above the peripheral device, a plurality of memory strings each extending vertically on the semiconductor layer, and a shielding layer disposed between the peripheral device and the semiconductor layer. The shielding layer includes a conduction region configured to receive a grounding voltage during operation of the 3D memory device.

In another example, a 3D memory device includes a substrate, a plurality of memory strings each extending vertically on the substrate, a semiconductor layer disposed above the plurality of memory strings, a peripheral device disposed on the semiconductor layer, and a shielding layer disposed between the plurality of memory strings and the semiconductor layer. The shielding layer includes a conduction region configured to receive a grounding voltage during operation of the 3D memory device.

In a different example, a method for forming a 3D memory device is disclosed. A peripheral device is formed on a substrate. A first interconnect layer including a first plurality of interconnects is formed above the peripheral device. A shielding layer including a conduction region is formed above the first interconnect layer. A second interconnect layer including a second plurality of interconnects is formed above the shielding layer. The conduction region of the shielding layer covers an area of the first and second plurality of interconnects in the first and second interconnect layers. A plurality of memory strings each extending vertically above the second interconnect layer are formed.

In another example, a method for forming a 3D memory device is disclosed. A plurality of memory strings each extending vertically on a substrate are formed. A first interconnect layer including a first plurality of interconnects is formed above the plurality of memory strings. A shielding layer including a conduction region is formed above the first interconnect layer. A second interconnect layer including a second plurality of interconnects is formed above the shielding layer. The conduction region of the shielding layer covers an area of the first and second plurality of interconnects in the first and second interconnect layers. A peripheral device is formed above the second interconnect layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
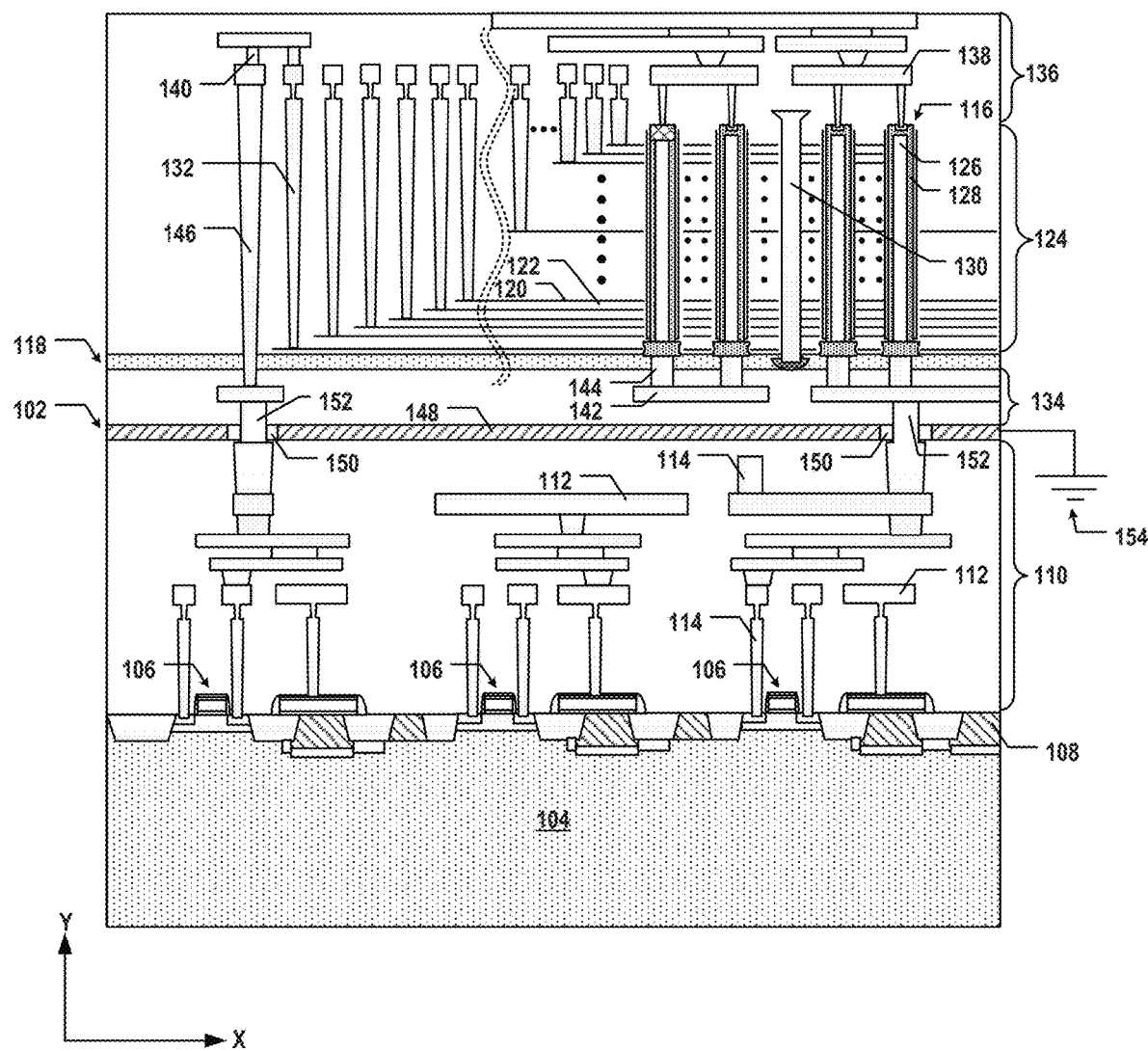
FIG. 1A illustrates a cross-section of an exemplary 3D memory device having a shielding layer, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, the periphery circuits and memory array are stacked to save wafer area and increase memory cell density. The stacked memory device architecture often requires additional metal routing, which can result in extra capacitance and resistance. Subsequently, when the noise factor increases, signals can be distorted and therefore, fail in signal integrity during transmission. Moreover, coupling effect between periphery circuits and memory array becomes a serious problem as their metal interconnects are much closer in a stacked memory device architecture than in a non-stacked architecture, thereby exacerbating signal distortion during memory operation.

Various embodiments in accordance with the present disclosure provide a 3D memory device having a shielding layer between the stacked periphery circuits and memory array with a grounding voltage applied on it during the memory operation. The grounding voltage applied to the conductive materials (e.g., metal, metal alloy, metal silicide, and/or doped semiconductor) in the shielding layer can shield the transfer of electrical energy between metal interconnects or any other circuit segments and thus, reduce or even avoid the coupling effect between the stacked periphery circuits and memory array in a 3D memory device during its operation.

FIG. 1A illustrates a cross-section of an exemplary 3D memory device 100 having a shielding layer 102 according to some embodiments of the present disclosure. 3D memory device 100 represents an example of a monolithic 3D memory device. The term "monolithic" means that the components of 3D memory device 100 are formed on a single substrate. 3D memory device 100 can include a substrate 104, which can include silicon (e.g., single crystalline silicon), silicon germanium (SiGe), gallium arsenide (GaAs), germanium (Ge), silicon on insulator (SOI), or any other suitable materials.

3D memory device 100 can include a peripheral device on substrate 104. The peripheral device can be formed "on" substrate 104, in which the entirety or part of the peripheral device is formed in substrate 104 (e.g., below the top surface of substrate 104) and/or directly on substrate 104. The peripheral device can include a plurality of transistors 106 formed on substrate 104. Isolation regions 108 and doped regions (e.g., source regions and drain regions of transistors 106) can be formed in substrate 104 as well.

In some embodiments, the peripheral device can include any suitable digital, analog, and/or mixed-signal peripheral circuits used for facilitating the operation of 3D memory device 100. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 104 using complementary metal-oxide-semiconductor (CMOS) technology (also known as a "CMOS chip").

3D memory device 100 can include an interconnect layer 110 above transistors 106 (referred to herein as a "peripheral interconnect layer") to transfer electrical signals to and from transistors 106. Peripheral interconnect layer 110 can include a plurality of interconnects (also referred to herein as "contacts"), including lateral interconnect lines 112 and vertical interconnect access (via) contacts 114. As used herein, the term "interconnects" can broadly include any suitable types of interconnects, such as middle-end-of-line (MEOL) interconnects and back-end-of-line (BEOL) interconnects. Peripheral interconnect layer 110 can further include one or more interlayer dielectric (ILD) layers (also known as "intermetal dielectric (IMD) layers") in which interconnect lines 112 and via contacts 114 can form. That is, peripheral interconnect layer 110 can include interconnect lines 112 and via contacts 114 in multiple ILD layers. Interconnect lines 112 and via contacts 114 in peripheral interconnect layer 110 can include conductor materials including, but not limited to, tungsten (W), cobalt (Co), copper (Cu), aluminum (Al), silicides, or any combination thereof. The ILD layers in peripheral interconnect layer 110 can include dielectric materials including, but not limited to, silicon oxide, silicon nitride, silicon oxynitride, low dielectric constant (low-k) dielectrics, or any combination thereof.

3D memory device 100 can include a memory array device above the peripheral device. It is noted that x and y axes are added in FIG. 1A to further illustrate the spatial relationship of the components in 3D memory device 100. Substrate 104 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 104) in the y-direction (the vertical direction or thickness direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND memory strings 116 each extending vertically on a semiconductor layer 118 disposed above the peripheral device (e.g., transistors 106). Semiconductor layer 118 can include polycrystalline silicon (polysilicon) or amorphous silicon deposited by, for example, physical vapor deposition (PVD), chemical vapor deposition (CVD), or atomic layer deposition (ALD). Semiconductor layer 118 can be doped to form doped regions in which source regions of NAND memory strings 116 can be formed. It is understood that in FIG. 1A, as 3D memory device 100 is a monolithic 3D memory device in which the memory array device is disposed above the peripheral device, NAND memory strings 116 are formed directly on deposited semiconductor layer 118, as opposed to substrate 104 (e.g., a single crystalline silicon).

The memory array device can include NAND memory strings 116 that extend vertically through a plurality of pairs each including a conductor layer 120 and a dielectric layer 122 (referred to herein as "conductor/dielectric layer pairs"). The stacked conductor/dielectric layer pairs are also referred to herein as an "alternating conductor/dielectric stack" 124. Alternating conductor/dielectric stack 124 can be formed on semiconductor layer 118. Conductor layers 120 and dielectric layers 122 in alternating conductor/dielectric stack 124 alternate in the vertical direction. In other words, except the ones at the top or bottom of alternating conductor/dielectric stack 124, each conductor layer 120 can be adjoined by two dielectric layers 122 on both sides, and each dielectric layer 122 can be adjoined by two conductor layers 120 on both sides. Conductor layers 120 can each have the same thickness or different thicknesses. Similarly, dielectric layers 122 can each have the same thickness or different thicknesses. Conductor layers 120 can include conductor materials including, but not limited to, W, Co, Cu, Al, doped silicon, silicides, or any combination thereof. Dielectric layers 122 can include dielectric materials including, but not limited to, silicon oxide, silicon nitride, silicon oxynitride, or any combination thereof.

As shown in FIG. 1A, each NAND memory string 116 can include a semiconductor channel 126 and a dielectric layer 128 (also known as a "memory film"). In some embodiments, semiconductor channel 126 includes silicon, such as amorphous silicon, polysilicon, or single crystalline silicon. In some embodiments, dielectric layer 128 is a composite layer including a tunneling layer, a storage layer (also known as "charge trap/storage layer"), and a blocking layer. Each NAND memory string 116 can have a cylinder shape (e.g., a pillar shape). Semiconductor channel 126, the tunneling layer, the storage layer, and the blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$), or hafnium oxide ($HfO_2$) or tantalum oxide ($Ta_2O_5$) layer, and so on.

In some embodiments, the memory array device further includes a gate line slit (GLS) 130 that extends vertically through alternating conductor/dielectric stack 124. GLS 130 can be used to form the conductor/dielectric layer pairs in alternating conductor/dielectric stack 124 by a gate replacement process. In some embodiments, GLS 130 is firstly filled with dielectric materials, for example, silicon oxide, silicon nitride, or any combination thereof, for separating the NAND memory string array into different regions (e.g., memory fingers and/or memory blocks). Then, GLS 130 is filled with conductive and/or semiconductor materials, for example, W, Co, polysilicon, or any combination thereof, for electrically controlling an array common source (ACS).

In some embodiments, the memory array device further includes word line via contacts 132 in a staircase structure region of alternating conductor/dielectric stack 124. Word line via contacts 132 can extend vertically within a dielectric layer. Each word line via contact 132 can have its lower end in contact with corresponding conductor layer 120 in alternating conductor/dielectric stack 124 to individually address a corresponding word line of the memory array device. As used herein, the "upper end" of a component (e.g., word line via contact 132) is the end farther away from substrate 104 in the y-direction, and the "lower end" of the component is the end closer to substrate 104 in the y-direction. Word line via contacts 132 can be contact holes and/or contact trenches filled with a conductor (e.g., W). In some embodiments, the contact holes and/or contact trenches are also filled with a barrier layer, an adhesion glue layer, and/or a seed layer besides the conductor.

Similar to the peripheral device, the memory array device of 3D memory device 100 can also include interconnect layers for transferring electrical signals to and from NAND memory strings 116. As shown in FIG. 1A, 3D memory device 100 can include an interconnect layer 134 (referred to herein as a "lower array interconnect layer") below NAND memory strings 116 and semiconductor layer 118 and an interconnect layer 136 (referred to herein as an "upper array interconnect layer") above NAND memory strings 116 and semiconductor layer 118.

Upper array interconnect layer 136 can be formed above alternating conductor/dielectric stack 124 and include a plurality of interconnects, including interconnect lines 138 and via contacts 140 in one or more ILD layers. In some embodiments, the interconnects in upper array interconnect layer 136 include bit lines and bit line contacts each in contact with the upper end of corresponding NAND memory string 116 to individually address corresponding NAND memory string 116. In some embodiments, the interconnects in upper array interconnect layer 136 also include source lines in contact with the array common sources of NAND memory strings 116. In some embodiments, upper array interconnect layer 136 further includes any other suitable BEOL interconnects that can transfer electrical signals between 3D memory device 100 and peripheral circuits. Interconnect lines 138 and via contacts 140 in upper array interconnect layer 136 can include conductor materials including, but not limited to, W, Co, Cu, Al, silicides, or any combination thereof. The ILD layers in upper array interconnect layer 136 can include dielectric materials including, but not limited to, silicon oxide, silicon nitride, silicon oxynitride, low-k dielectrics, or any combination thereof.

Lower array interconnect layer 134 can include a plurality of interconnects, including interconnect lines 142 and via contacts 144 in one or more ILD layers. In some embodiments, the interconnects in lower array interconnect layer 134 include via contacts 144 each in contact with the lower end of corresponding NAND memory string 116 and extending vertically through semiconductor layer 118. In some embodiments, the interconnects in lower array interconnect layer 134 are used for backside metal routing of the memory array device.

In some embodiments, the memory array device further includes one or more through array contacts (TACs) 146 that extend vertically through alternating conductor/dielectric stack 124 and semiconductor layer 118. The upper end of TAC 146 can contact an interconnect in upper array interconnect layer 136, and the lower end of TAC 146 can contact another interconnect in lower array interconnect layer 134. TAC 146 can thus make an electrical connection between peripheral interconnect layer 110 and upper array interconnect layer 136 and carry electrical signals from the peripheral device to a BEOL interconnect of the memory array device.

During the operation of 3D memory device 100 (when 3D memory device 100 is in use, for example, performing cell read, write/program, erase, setting, boosting, etc.), coupling effect between the interconnects in peripheral interconnect layer 110 and lower array interconnect layer 134 can cause signal distortion. To address this problem, as shown in FIG. 1A, 3D memory device 100 includes shielding layer 102 between transistors 106 and semiconductor layer 118. In some embodiments, shielding layer 102 is formed between peripheral interconnect layer 110 and lower array interconnect layer 134 to reduce the coupling effect between the interconnects in the adjacent interconnect layers during the operation of 3D memory device 100. As shown in FIG. 1A, peripheral interconnect layer 110 is disposed between transistors 106 and shielding layer 102, and lower array interconnect layer 134 is disposed between NAND memory strings 116 and shielding layer 102.

Shielding layer 102 can include one or more conduction regions 148 and one or more isolation regions 150. Conduction region 148 can include conductive materials that have a higher electrical conductivity than an undoped semiconductor material, such as undoped silicon (e.g., amorphous silicon, single crystalline silicon, or polysilicon). In some embodiments, conduction region 148 has an electrical conductivity of at least about $1\times10^4$ S/m at about 20° C., such as at least $1\times10^4$ S/m at 20° C. In some embodiments, conduction region 148 has an electrical conductivity of between about $1\times10^4$ S/m and about $1\times10^8$ S/m at about 20° C., such as between $1\times10^4$ S/m and $1\times10^8$ S/m at 20° C. (e.g., $1\times10^4$ S/m, $1\times10^5$ S/m, $5\times10^5$ S/m, $1\times10^6$ S/m, $2\times10^6$ S/m, $3\times10^6$ S/m, $4\times10^6$ S/m, $5\times10^6$ S/m, $6\times10^6$ S/m, $7\times10^6$ S/m, $8\times10^6$ S/m, $9\times10^6$ S/m, $1\times10^7$ S/m, $2\times10^7$ S/m, $3\times10^7$ S/m, $4\times10^7$ S/m, $5\times10^7$ S/m, $6\times10^7$ S/m, $7\times10^7$ S/m, $8\times10^7$ S/m, $9\times10^7$ S/m, $1\times10^8$ S/m, any range bounded by the lower end by any of these values, or in any range defined by any two of these values, at 20° C.). The conductive materials in conduction region 148 can include, but are not limited to, metals, metal alloys, metal silicides, and doped semiconductors. In some embodiments, conduction region 148 includes one or more metals, such as W, Cu, Co, Al, nickel (Ni), and titanium (Ti). Conduction region 148 can also include any other suitable metals, such as silver (Ag), gold (Au), platinum (Pt), ruthenium (Ru), etc. In some embodiments, conduction region 148 includes one or more metal alloys, each of which is an alloy of at least two of Cu, Co, Ni, Ti, and W (e.g., TiNi alloy or a combination of TiNi alloy and TiW alloy), or any other suitable metal alloys of, for example, Ag, Al, Au, Pt, iron (Fe), chromium (Cr), etc. In some embodiments, conduction region 148 includes one or more metal silicides, such as copper silicide, cobalt silicide, nickel silicide, titanium silicide, and tungsten silicide. Conduction region 148 can also include any other suitable metal silicides, such as silver silicide, aluminum silicide, gold silicide, platinum silicide, etc. In some embodiments, conduction region 148 includes a semiconductor material doped with a dopant at a concentration such that the electrical conductivity of conduction region 148 is increased into the ranges described above.

In some embodiments, shielding layer 102 has a thickness between about 1 nm and about 1 µm, such as between 1 nm and 1 µm (e.g., 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, any range bounded by the lower end by any of these values, or in any range defined by any two of these values).

In some embodiments, shielding layer 102 has a thickness between about 1 μm and about 20 μm, such as between 1 μm and 20 μm (e.g., 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, any range bounded by the lower end by any of these values, or in any range defined by any two of these values). In some embodiments, shielding layer 102 is a compound layer having a plurality of films, such as one or more conductive films and dielectric films. The thickness ranges described above may refer to the total thickness of a compound shielding layer or the thickness of the conductive film(s) in a compound shielding layer.

Shielding layer 102 can be patterned to form any suitable layout with different numbers of conduction regions 148 and isolation regions 150 in different arrangements. As shown in FIG. 1A, in order to electrically connect the stacked memory array device (e.g., NAND memory strings 116) and the peripheral device (e.g., transistors 106) on different planes of 3D memory device 100, interconnects are formed between peripheral interconnect layer 110 and array interconnect layers 134 and 136. As a result, 3D memory device 100 can include via contacts 152 extending vertically through shielding layer 102. Via contact 152 can be in contact with the interconnects in peripheral interconnect layer 110 and the interconnects in lower array interconnect layer 134. Via contact 152 can also be in contact with the interconnects in peripheral interconnect layer 110 and TAC 146 to make an electrical connection with the interconnects in upper array interconnect layer 136.

In some embodiments, isolation region 150 extends across the entire thickness of shielding layer 102 to electrically isolate conduction region 148 and via contacts 152. Isolation region 150 can include dielectric materials including, but not limited to, silicon oxide, silicon nitride, silicon oxynitride, doped silicon oxide, any other suitable dielectric materials, or any combination thereof. Patterning process (e.g., photolithography and dry/wet etch) can be used for patterning isolation region 150 in shielding layer 102. Isolation region 150 then can be formed by thermal growth and/or thin film deposition of the dielectric materials in the patterned region.

Figure 2:
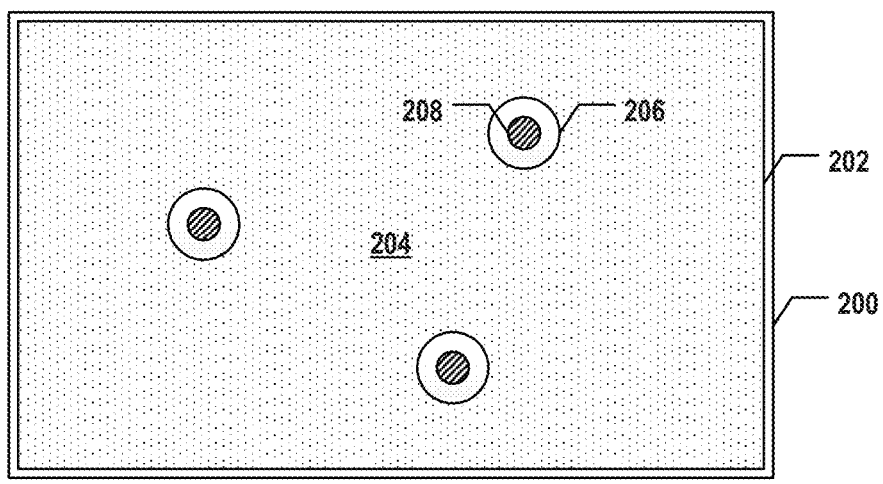
FIG. 2 illustrates a plan view of an exemplary shielding layer, according to some embodiments.

For example, FIG. 2 illustrates a plan view of an exemplary shielding layer 202, according to some embodiments. As shown in FIG. 2, shielding layer 202 includes a conduction region 204 and isolation regions 206 for electrically isolating conduction region 204 and via contacts 208 extending through shielding layer 202. Conduction region 204 can cover substantially the entire area of a substrate 200 except for the areas occupied by isolation regions 206 and via contacts 208.

Figure 3A:
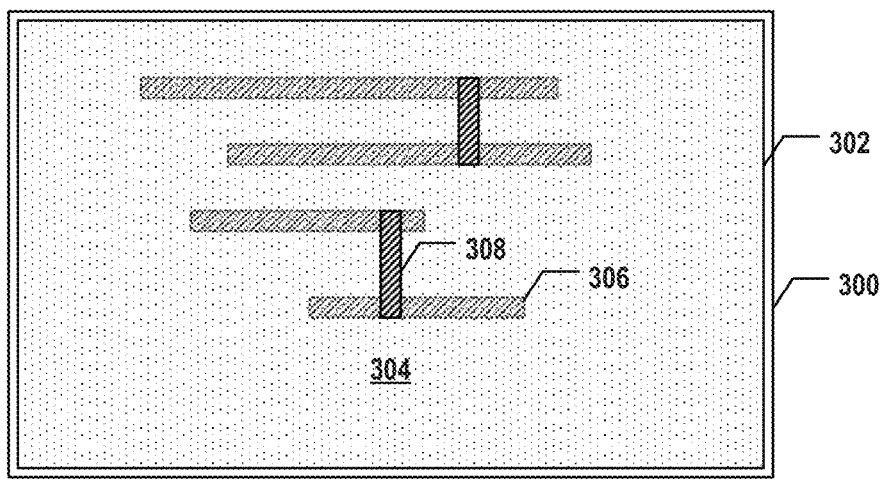
FIG. 3A illustrates an exemplary layout of a shielding layer, according to some embodiments.
Figure 3B:
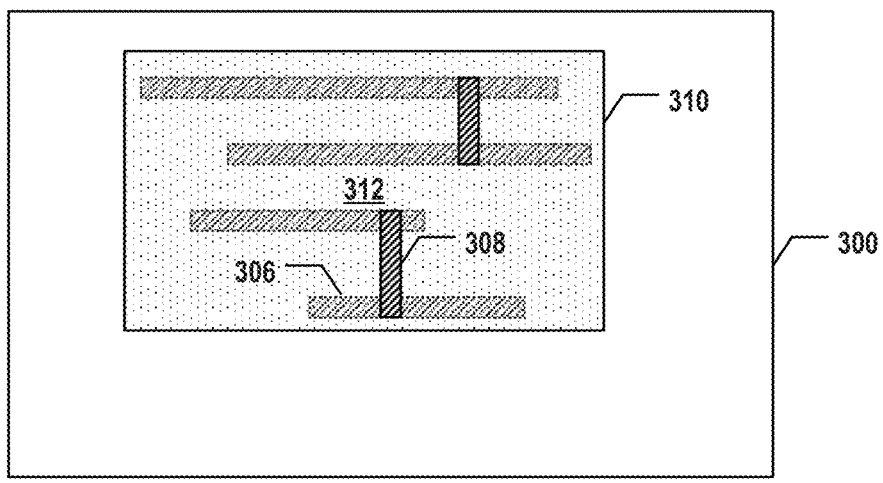
FIG. 3B illustrates another exemplary layout of a shielding layer, according to some embodiments.

In addition to accommodating via contacts 152 through shielding layer 102, the layout of shielding layer 102 can vary with respect to the area it covers. For example. FIGS. 3A-3B illustrate exemplary layouts of shielding layers 302 and 310, according to various embodiments. As shown in FIG. 3A, interconnects 306 and 308 in adjacent interconnect layers are separated vertically by shielding layer 302. A conduction region 304 of shielding layer 302 covers substantially the entire area of a substrate 300 (except for the areas occupied by the isolation regions and via contacts, not shown) regardless of the layout of interconnects 306 and 308. As shown in FIG. 3B, a conduction region 312 of shielding layer 310 does not cover substantially the entire area of substrate 300, but instead, covers the area of interconnects 306 and interconnects 308 in the adjacent interconnect layers separated by shielding layer 310 (e.g., peripheral interconnect layer 110 and lower array interconnect layer 134 in FIG. 1A). It is understood that the layout of a shielding layer is not limited to the examples illustrated above and can vary in different embodiments as long as its conduction region covers at least the area of interconnects in the adjacent interconnect layers separated by the shielding layer.

Referring back to FIG. 1A, conduction region 148 of shielding layer 102 is configured to receive a grounding voltage during the operation of 3D memory device 100. Conduction region 148 can be electrically connected to a voltage source 154 (or ground) during the operation of 3D memory device 100. In some embodiments, the grounding voltage is between about 0.1 V and about 50 V, such as between 0.1 V and 50 V (e.g., 0.1 V, 0.2 V, 0.3 V, 0.4 V, 0.5 V, 0.6 V, 0.7 V, 0.8 V, 0.9 V, 1 V, 2 V, 3 V, 4 V, 5 V, 6 V, 7 V, 8 V, 9 V, 10 V, 15 V, 20 V, 25 V, 30 V, 35 V, 40 V, 45 V, 50 V, any range bounded by the lower end by any of these values, or in any range defined by any two of these values). It is understood that the grounding voltage can be adjusted based on various attributes of shielding layer 102, such as the thickness and electrical conductivity. During the operation of 3D memory device 100, the grounding voltage applied to conduction region 148 of shielding layer 102 can reduce (or avoid) the coupling effect between the interconnects in peripheral interconnect layer 110 and lower array interconnect layer 134.

Figure 1B:
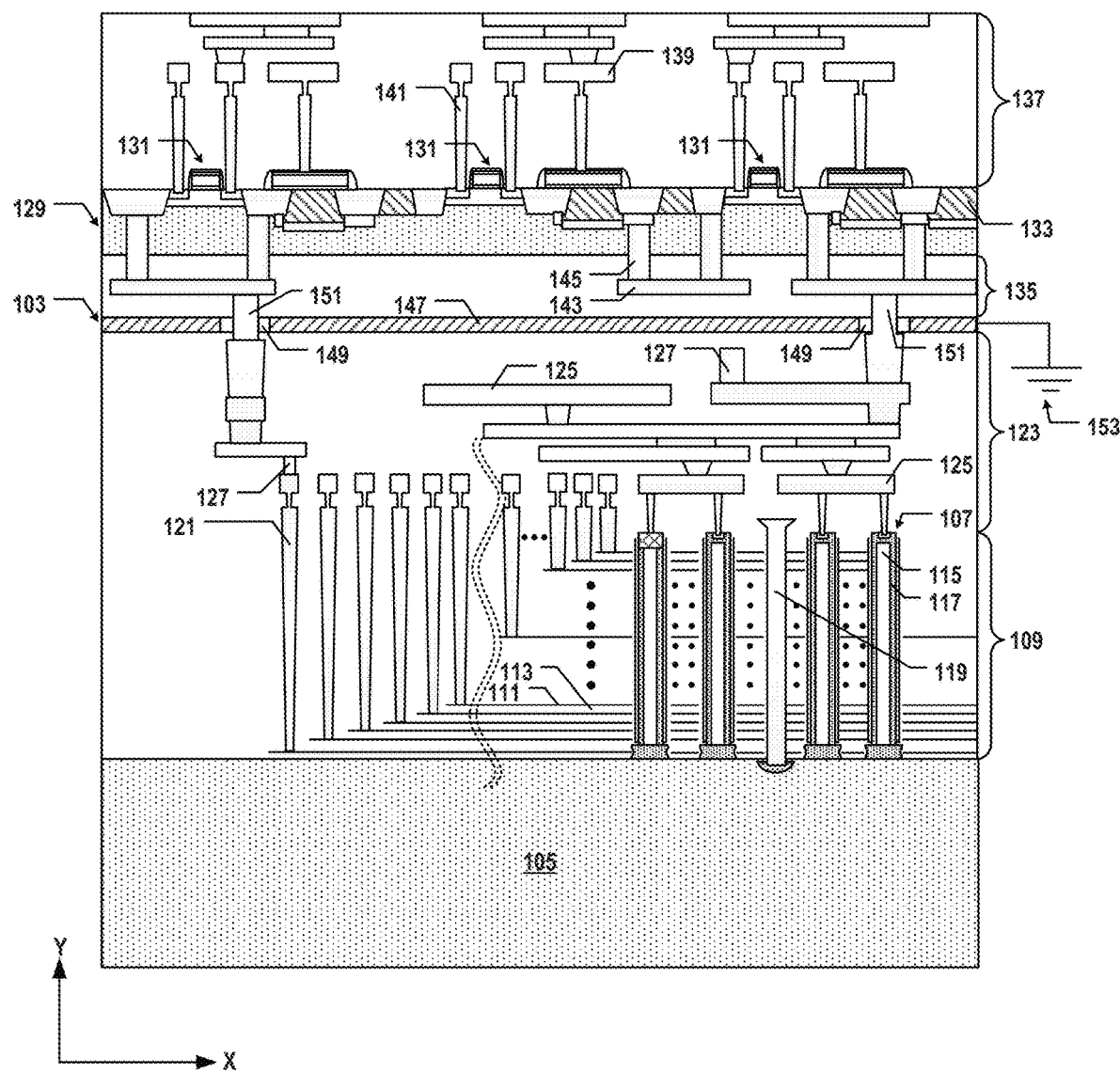
FIG. 1B illustrates a cross-section of another exemplary 3D memory device having a shielding layer, according to some embodiments.

FIG. 1B illustrates a cross-section of another exemplary 3D memory device 101 having a shielding layer 103, according to some embodiments of the present disclosure. Similar to 3D memory device 100 described above in FIG. 1A, 3D memory device 101 represents an example of a monolithic 3D memory device in which a peripheral device and a memory array device are stacked and separated by shielding layer 103. Different from 3D memory device 100 described above in FIG. 1A in which the peripheral device is below the memory array device, 3D memory device 101 in FIG. 1B includes a peripheral device disposed above a memory array device. It is understood that the details of similar structures (e.g., materials, fabrication process, functions, etc.) in both 3D memory devices 100 and 101 may not be repeated below.

3D memory device 101 can include a memory array device on a substrate 105. In some embodiments, an array of NAND memory strings 107 each extends vertically through an alternating conductor/dielectric stack 109 on substrate 105. Alternating conductor/dielectric stack 109 can include a plurality of pairs each including a conductor layer 111 and a dielectric layer 113. As shown in FIG. 1B, each NAND memory string 107 can include a semiconductor channel 115 and a dielectric layer 117 (also known as a "memory film").

In some embodiments, the memory array device further includes a GLS 119 that extends vertically through alternating conductor/dielectric stack 109. GLS 119 can be used to form the conductor/dielectric layer pairs in alternating conductor/dielectric stack 109 by a gate replacement process. In some embodiments, GLS 119 is firstly filled with dielectric materials, for example, silicon oxide, silicon nitride, or any combination thereof, for separating the NAND memory string array into different regions (e.g., memory fingers and/or memory blocks). In some embodiments, the memory array device further includes word line via contacts 121 in a staircase structure region of alternating conductor/dielectric stack 109. Word line via contacts 121 can extend vertically within a dielectric layer. Each word line via contact 121 can have its lower end in contact with corresponding conductor layer 111 in alternating conductor/dielectric stack 109 to individually address a corresponding word line of the memory array device.

3D memory device 101 can include an interconnect layer 123 above NAND memory strings 107 (referred to herein as an "array interconnect layer") to transfer electrical signals to and from NAND memory strings 107. Array interconnect layer 123 can include a plurality of interconnects, including interconnect lines 125 and via contacts 127. In some embodiments, the interconnects in array interconnect layer 123 include bit lines and bit line contacts each in contact with the upper end of corresponding NAND memory string 107 to individually address corresponding NAND memory string 107. In some embodiments, the interconnects in array interconnect layer 123 also include source lines in contact with the array common sources of NAND memory strings 107. In some embodiments, array interconnect layer 123 further includes any other suitable BEOL interconnects that can transfer electrical signals between the stacked memory array device and peripheral device.

3D memory device 101 can include a peripheral device formed on a semiconductor layer 129 disposed above the memory array device (e.g., NAND memory strings 107). Semiconductor layer 129 can include polysilicon or amorphous silicon. It is understood that in FIG. 1B, as 3D memory device 101 is a monolithic 3D memory device in which the peripheral device is disposed above the memory array device, the peripheral device (e.g., transistors 131) is formed directly on deposited semiconductor layer 129, as opposed to substrate 105 (e.g., a single crystalline silicon). Isolation regions 133 and doped regions (e.g., source regions and drain regions of transistors 131) can be formed in semiconductor layer 129 as well. In some embodiments, the peripheral device can include any suitable digital, analog, and/or mixed-signal peripheral circuits used for facilitating the operation of 3D memory device 101.

Similar to the memory array device, the peripheral device of 3D memory device 101 can also include interconnect layers for transferring electrical signals to and from transistors 131. As shown in FIG. 1B, 3D memory device 101 can include an interconnect layer 135 (referred to herein as a "lower peripheral interconnect layer") below transistors 131 and semiconductor layer 129 and an interconnect layer 137 (referred to herein as an "upper peripheral interconnect layer") above transistors 131 and semiconductor layer 129.

Upper peripheral interconnect layer 137 can be formed above transistors 131 and include a plurality of interconnects, including interconnect lines 139 and via contacts 141 in one or more ILD layers. In some embodiments, upper peripheral interconnect layer 137 includes any suitable BEOL interconnects that can transfer electrical signals between 3D memory device 101 and peripheral circuits. Lower peripheral interconnect layer 135 can include a plurality of interconnects, including interconnect lines 143 and via contacts 145 in one or more ILD layers. In some embodiments, the interconnects in lower peripheral interconnect layer 135 include via contacts 145 extending vertically through semiconductor layer 129. In some embodiments, the interconnects in lower peripheral interconnect layer 135 are used for backside metal routing of the peripheral device (e.g., transistors 131).

During the operation of 3D memory device 101 (when 3D memory device 101 is in use, for example, performing cell read, write/program, erase, setting, boosting, etc.), coupling effect between the interconnects in array interconnect layer 123 and lower peripheral interconnect layer 135 can cause signal distortion. To address this problem, as shown in FIG. 1B, 3D memory device 101 includes shielding layer 103 between NAND memory strings 107 and semiconductor layer 129. In some embodiments, shielding layer 103 is formed between array interconnect layer 123 and lower peripheral interconnect layer 135 to reduce the coupling effect between the interconnects in the adjacent interconnect layers during the operation of 3D memory device 101. As shown in FIG. 1B, array interconnect layer 123 is disposed between NAND memory strings 107 and shielding layer 103, and lower peripheral interconnect layer 135 is disposed between transistors 131 and shielding layer 103.

Shielding layer 103 can include one or more conduction regions 147 and one or more isolation regions 149. Shielding layer 103 can be patterned to form any suitable layout with different numbers of conduction regions 147 and isolation regions 149 in different arrangements. As shown in FIG. 1B, in order to electrically connect the stacked memory array device (e.g., NAND memory strings 107) and the peripheral device (e.g., transistors 131) on different planes of 3D memory device 101, interconnects are formed between array interconnect layer 123 and peripheral interconnect layers 135 and 137. As a result, 3D memory device 101 can include via contacts 151 extending vertically through shielding layer 103. Via contact 151 can be in contact with the interconnects in array interconnect layer 123 and the interconnects in lower peripheral interconnect layer 135. In some embodiments, isolation region 149 extends across the entire thickness of shielding layer 103 to electrically isolate conduction region 147 and via contacts 151.

In some embodiments, conduction region 147 of shielding layer 103 is configured to receive a grounding voltage during the operation of 3D memory device 101. Conduction region 147 can be electrically connected to a voltage source 153 (or ground) during the operation of 3D memory device 101. It is understood that the grounding voltage can be adjusted based on various attributes of shielding layer 103, such as the thickness and electrical conductivity. During the operation of 3D memory device 101, the grounding voltage applied to conduction region 147 of shielding layer 103 can reduce (or avoid) the coupling effect between the interconnects in array interconnect layer 123 and lower peripheral interconnect layer 135. It is understood that other attributes of shielding layer 103 (and its conduction region 147 and isolation region 149) can be similar to those described above with respect to shielding layer 102 in FIGS. 1A, 2, and 3A-3B.

Figure 4A:
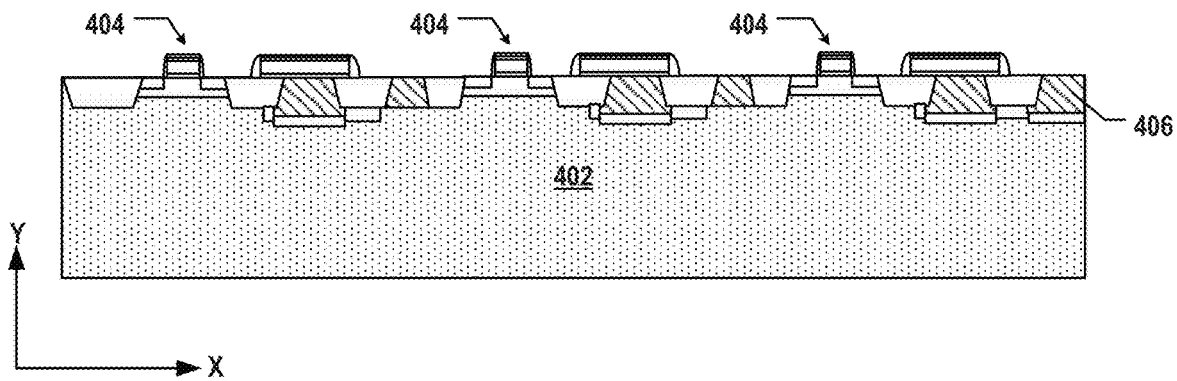
FIGS. 4A-4H illustrate a fabrication process for forming an exemplary 3D memory device having a shielding layer, according to some embodiments.
Figure 4B:
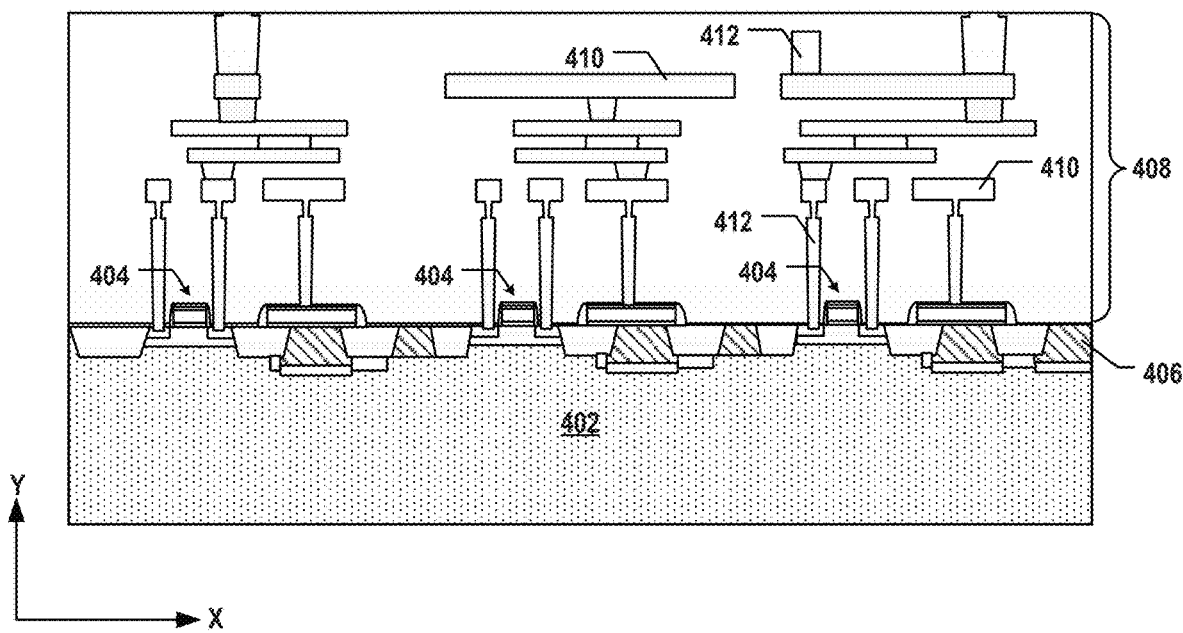

FIGS. 4A-4H illustrate a fabrication process for forming an exemplary 3D memory device having a shielding layer, according to some embodiments of the present disclosure. FIG. 5 is a flowchart of a method 500 for forming an exemplary 3D memory device having a shielding layer, according to some embodiments. Examples of the 3D memory device depicted in FIGS. 4A-4H and FIG. 5 include 3D memory device 100 depicted in FIG. 1A. FIGS. 4A-4H and FIG. 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a peripheral device is formed on a substrate. The substrate can be a silicon substrate. As illustrated in FIG. 4A, a peripheral device is formed on a silicon substrate 402. The peripheral device can include a plurality of transistors 404 formed on silicon substrate 402. Transistors 404 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 402, which function, for example, as source regions and/or drain regions of transistors 404. In some embodiments, isolation regions 406 (e.g., shallow trench isolations (STIs)) are also formed in silicon substrate 402 by wet/dry etch and thin film deposition.

Method 500 proceeds to operation 504, as illustrated in FIG. 5, in which a first interconnect layer (e.g., a peripheral interconnect layer) is formed above the peripheral device. The first interconnect layer can include a first plurality of interconnects in one or more ILD layers. As illustrated in FIG. 4B, a peripheral interconnect layer 408 can be formed on silicon substrate 402 and above transistors 404. Peripheral interconnect layer 408 can include interconnects, including interconnect lines 410 and via contacts 412 of MEOL and/or BEOL in a plurality of ILD layers, to make electrical connections with the peripheral device (e.g., transistors 404).

In some embodiments, peripheral interconnect layer 408 includes multiple ILD layers and interconnects therein formed in multiple processes. For example, interconnect lines 410 and via contacts 412 can include conductor materials deposited by one or more thin film deposition processes including, but not limited to, CVD, PVD, ALD, electroplating, electroless plating, or any combination thereof. Fabrication processes to form interconnect lines 410 and via contacts 412 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 4B can be collectively referred to as an "interconnect layer" (e.g., peripheral interconnect layer 408).

Method 500 proceeds to operation 506, as illustrated in FIG. 5, in which a shielding layer is formed above the first interconnect layer (e.g., the peripheral interconnect layer). Operation 506 can include forming a conduction region and an isolation region above the first interconnect layer. The conduction region can cover the area of the interconnects in the first interconnect layer. In some embodiments, the conduction region of the shielding layer covers substantially the area of the substrate. Method 500 can further include additional operation(s) to form a contact (e.g., via contact) extending vertically through the shielding layer and in contact with the interconnects of the first interconnect layer. The contact can be electrically isolated from the conduction region in the shielding layer by the isolation region.

Figure 4C:
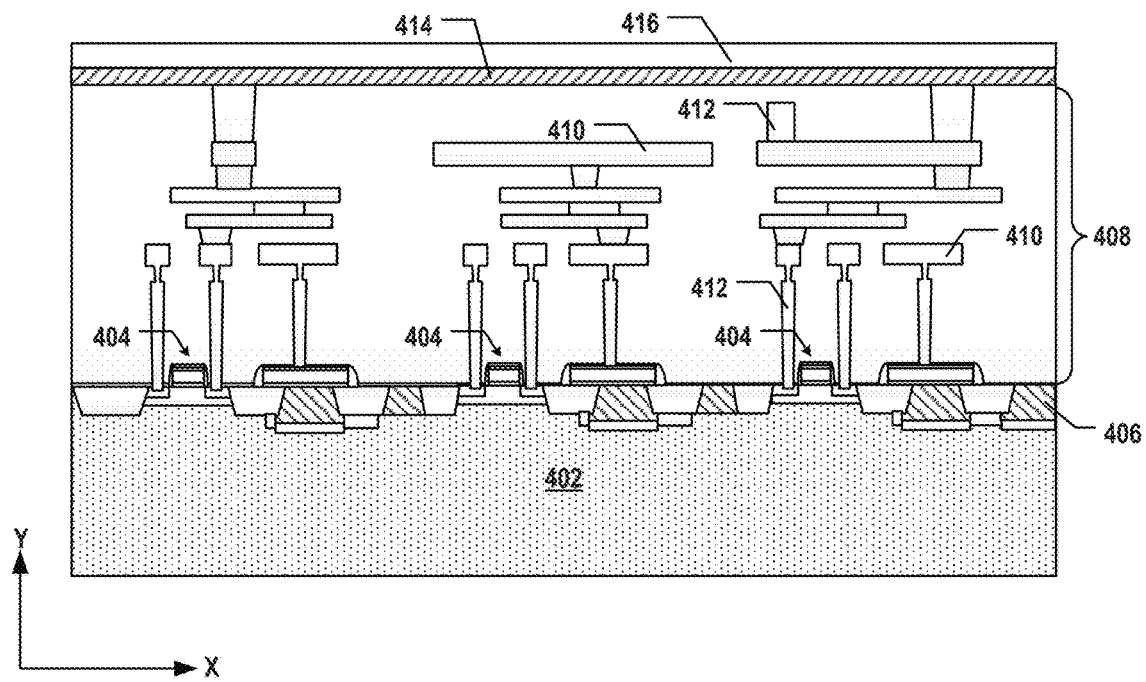
Figure 5:
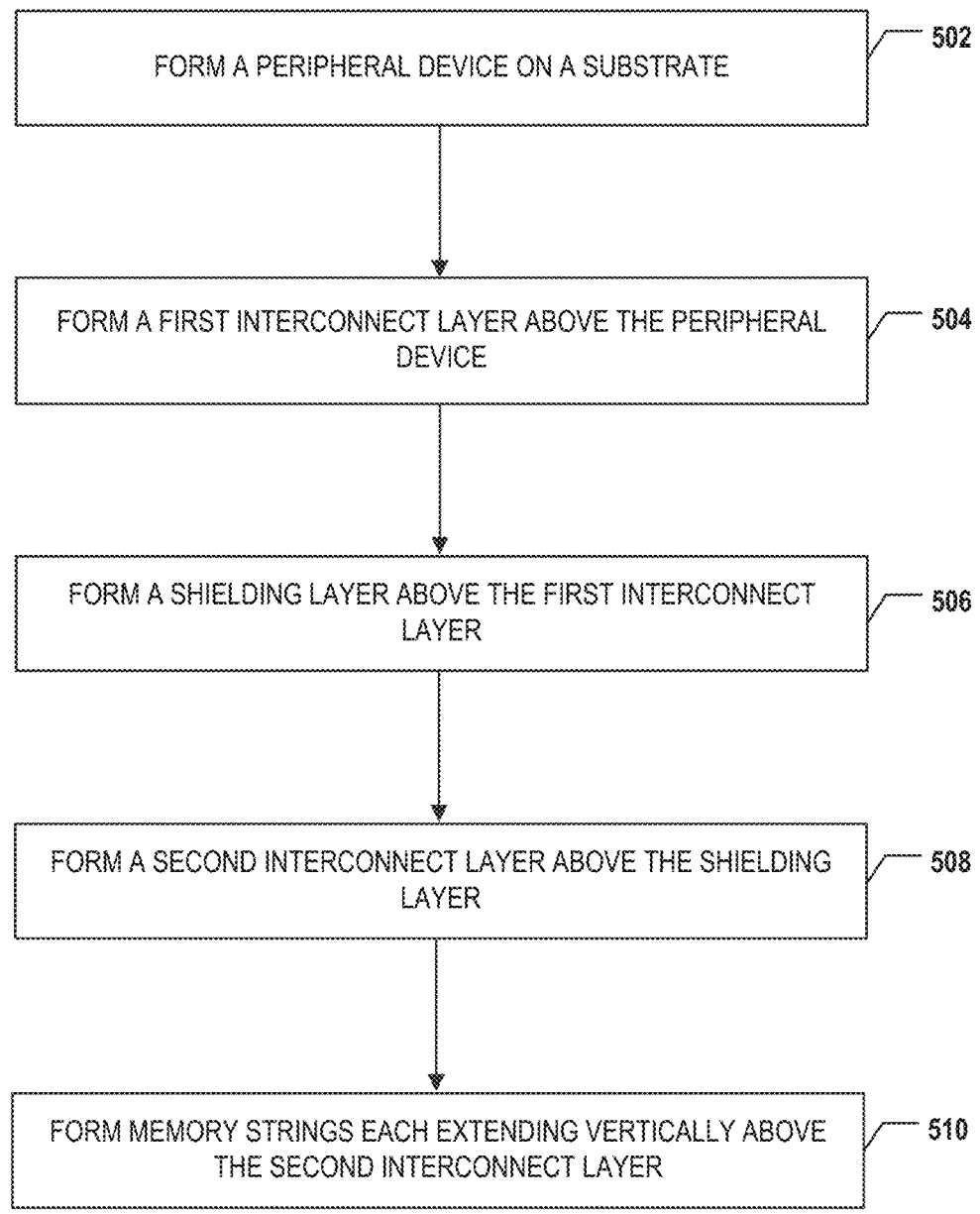
FIG. 5 is a flowchart of a method for forming an exemplary 3D memory device having a shielding layer, according to some embodiments.

As illustrated in FIG. 4C, a conductive film 414 can be formed on the top surface of peripheral interconnect layer 408. The conductive materials in conductive film 414 can include, but not limited to, metals, metal alloys, metal silicides, and doped semiconductors. In some embodiments, conductive film 414 includes one or more metals, such as Cu, Co, Ni, Ti, W, or any other suitable metals. In some embodiments, conductive film 414 includes one or more metal alloys, each of which is an alloy of at least two of Cu, Co, Ni, Ti, W (e.g., TiNi alloy or a combination of TiNi alloy and TiW alloy), or any other suitable metal alloys. In some embodiments, conductive film 414 includes one or more metal silicides, such as copper silicide, cobalt silicide, nickel silicide, titanium silicide, tungsten silicide, or any other suitable metal silicides. In some embodiments, conductive film 414 includes one or more doped semiconductors, such as doped polysilicon, doped amorphous silicon, or any other suitable doped semiconductors.

Conductive film 414 can be formed by one or more thin film deposition processes including, but not limited to, CVD, PVD, ALD, electroplating, electroless plating, or any combination thereof. Depending on the conductive materials in conductive film 414, the deposition of conductive film 414 may involve multiple processes. In some embodiments, the deposition of a metal silicide conductive film involves deposition of a silicon film, deposition of a metal film, and silicidation of the silicon and metal films by a thermal treatment (e.g., annealing, sintering, or any other suitable process). In some embodiments, the deposition of a doped semiconductor conductive film involves deposition of a semiconductor film and doping of the semiconductor film with dopants by ion implantation and/or thermal diffusion.

In some embodiments, deposited conductive film 414 has a thickness between about 1 nm and about 1 μm, such as between 1 nm and 1 μm (e.g., 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, any range bounded by the lower end by any of these values, or in any range defined by any two of these values). In some embodiments, deposited conductive film 414 has a thickness between about 1 μm and about 20 μm, such as between 1 μm and about 20 μm (e.g., 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, any range bounded by the lower end by any of these values, or in any range defined by any two of these values).

As illustrated in FIG. 4C, a dielectric film 416 can be formed on conductive film 414. Dielectric film 416 can include dielectric materials including, but not limited to, silicon oxide, silicon nitride, silicon oxynitride, low-k dielectrics, or any combination thereof. Dielectric film 416 can be formed by thermal growth and/or one or more thin film deposition processes including, but not limited to, CVD, PVD, ALD, or any combination thereof.

Figure 4D:
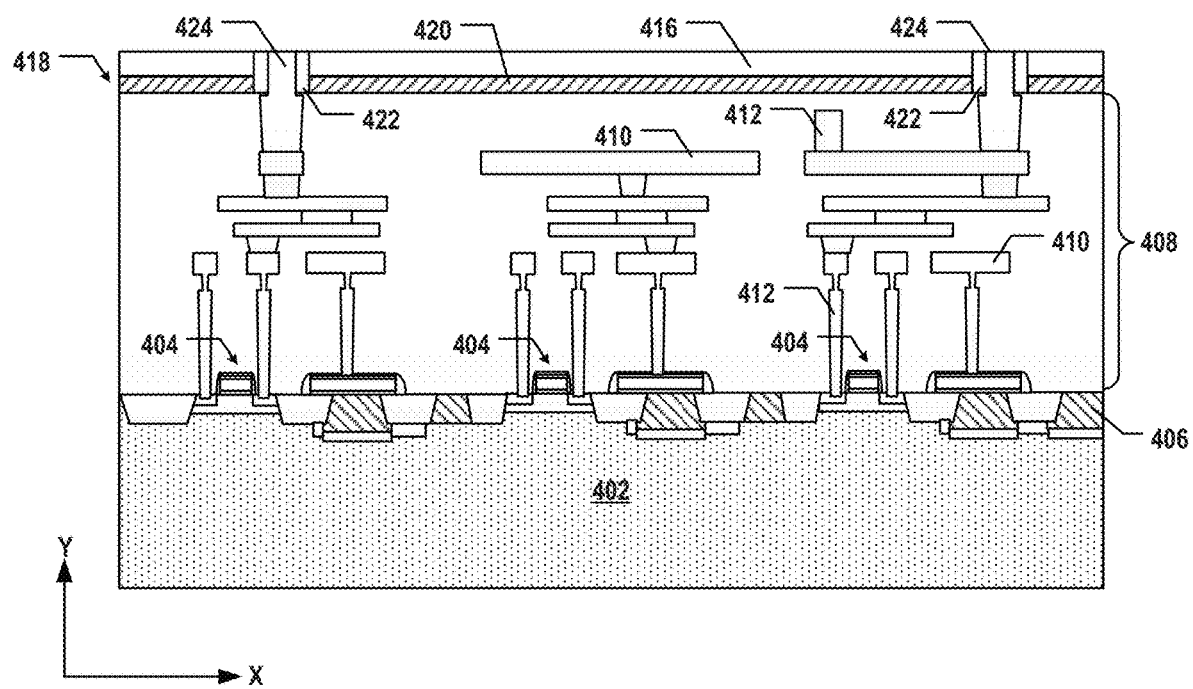

As illustrated in FIG. 4D, conductive film 414 can be patterned to form a shielding layer 418 having a conduction region 420 and one or more isolation regions 422. In some embodiments, conductive film 414 is patterned to form isolation regions 422, and the remaining conductive materials in conductive film 414 become conduction region 420. Conduction region 420 and isolation regions 422 can be collectively referred to herein as shielding layer 418. Isolation region 422 can include dielectric materials including, but not limited to, silicon oxide, silicon nitride, silicon oxynitride, doped silicon oxide, any other suitable dielectric materials, or any combination thereof. Patterning process (e.g., photolithography and dry/wet etch) can be used for patterning isolation regions 422 in shielding layer 418. Isolation regions 422 can then be formed by thermal growth and/or thin film deposition of dielectric materials in the patterned region. Shielding layer 418 can be patterned to form any suitable layout in different arrangements as described above with respect to FIG. 2 and FIGS. 3A-3B.

As illustrated in FIG. 4D, one or more via contacts 424 can be formed through dielectric film 416 and shielding layer 418 and in contact with interconnects 410 and 412 in peripheral interconnect layer 408. Via contacts 424 can be electrically isolated from conduction region 420 of shielding layer 418 by isolation regions 422. In some embodiments, via contacts 424 are formed by first patterning via holes through dielectric film 416 and shielding layer 418 using patterning process (e.g., photolithography and dry/wet etch of dielectric materials in dielectric film 416 and conductive materials in shielding layer 418). The via holes can be filled with a conductor (e.g., W). In some embodiments, filling the via holes includes depositing a barrier layer, an adhesion layer, and/or a seed layer before depositing the conductor.

Method 500 proceeds to operation 508, as illustrated in FIG. 5, in which a second interconnect layer (e.g., a lower array interconnect layer) is formed above the shielding layer. The second interconnect layer can include a second plurality of interconnects in one or more ILD layers. The conduction region of the shielding layer formed at operation 506 can cover the area of the interconnects in the second interconnect layer as well. That is, the conduction region of the shielding layer can cover the area of both the first and second interconnects in the first and second interconnect layers. A semiconductor layer (e.g., a silicon layer) can be formed above the second interconnect layer.

Figure 4E:
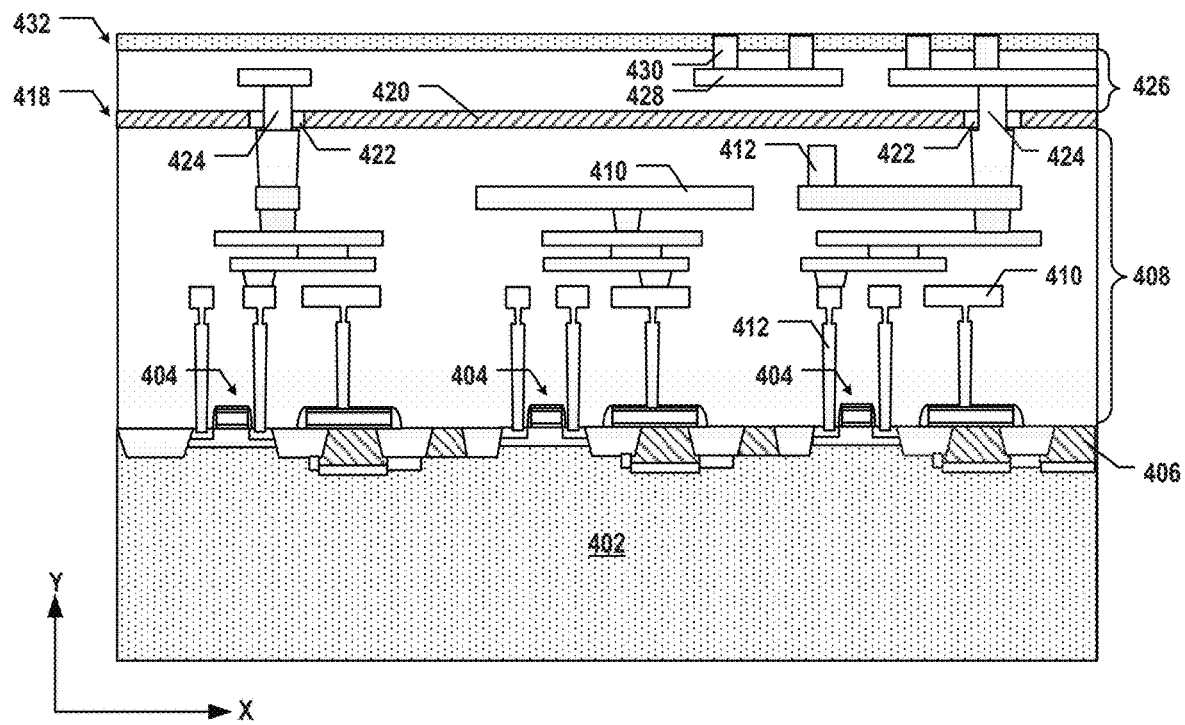

As illustrated in FIG. 4E, a lower array interconnect layer 426 can be formed above shielding layer 418. Lower array interconnect layer 426 can include interconnects, including interconnect lines 428 and via contacts 430 in one or more ILD layers for backside metal routing.

In some embodiments, lower array interconnect layer 426 includes multiple ILD layers (e.g., including dielectric film 416 in FIG. 4D) and interconnects therein formed in multiple processes. For example, interconnect lines 428 and via contacts 430 can include conductor materials deposited by one or more thin film deposition processes including, but not limited to, CVD, PVD, ALD, electroplating, electroless plating, or any combination thereof. Fabrication processes to form interconnect lines 428 and via contacts 430 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 4E as well as dielectric film 416 illustrated in FIG. 4D can be collectively referred to as an "interconnect layer" (e.g., lower array interconnect layer 426).

As illustrated in FIG. 4E, a silicon layer 432 can be formed above lower array interconnect layer 426. Silicon layer 432 can include polysilicon or amorphous silicon deposited by one or more thin film deposition processes including, but not limited to, CVD, PVD, ALD, or any combination thereof. Doped regions (e.g., wells) in silicon layer 432 can be formed by ion implantation and/or thermal diffusion of dopants at desired doping concentrations. Isolation regions (e.g., STIs) can also be formed in silicon layer 432 by wet/dry etch and thin film deposition.

Method 500 proceeds to operation 510, as illustrated in FIG. 5, in which a plurality of memory strings each extending vertically above the second interconnect layer (and the semiconductor layer) are formed. To form the memory strings, an alternating conductor/dielectric stack can be formed on the semiconductor layer, and each memory string can be formed to extend vertically through the alternating conductor/dielectric stack. A third interconnect layer (e.g., an upper array interconnect layer) can be formed above the alternating conductor/dielectric stack. In some embodiments, a contact (e.g., a TAC) extending vertically through the alternating conductor/dielectric stack and the semiconductor layer is formed and in contact with the second interconnect layer (e.g., the lower array interconnect layer), so that the first interconnect layer (e.g., the peripheral interconnect layer) is electrically connected to the third interconnect layer (e.g., the upper array interconnect layer).

Figure 4F:
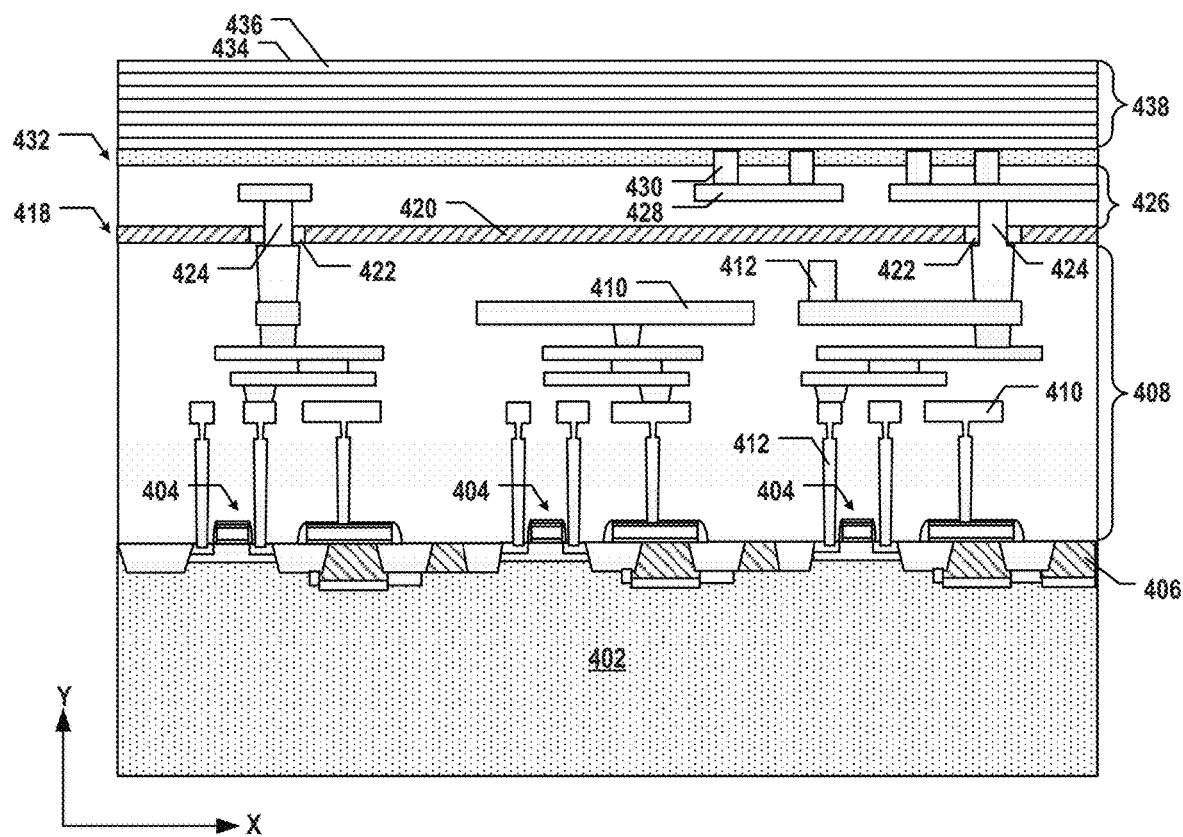

As illustrated in FIG. 4F, pairs of first dielectric layer 434 and second dielectric layer 436 (referred to herein as "dielectric layer pairs") are formed on silicon layer 432. The stacked dielectric layer pairs can form an alternating dielectric stack 438. Alternating dielectric stack 438 can include an alternating stack of first dielectric layer 434 and second dielectric layer 436 that is different from first dielectric layer 434. In some embodiments, each dielectric layer pair includes a layer of silicon nitride and a layer of silicon oxide. In some embodiments, first dielectric layers 434 can each have the same thickness or have different thicknesses. Similarly, second dielectric layers 436 can each have the same thickness or have different thicknesses. Alternating dielectric stack 438 can be formed by one or more thin film deposition processes including, but not limited to, CVD, PVD, ALD, or any combination thereof. In some embodiments, alternating dielectric stack 438 can be replaced by a plurality of conductor/dielectric layer pairs, i.e., an alternating stack of a conductor layer (e.g., polysilicon) and a dielectric layer (e.g., silicon oxide).

Figure 4G:
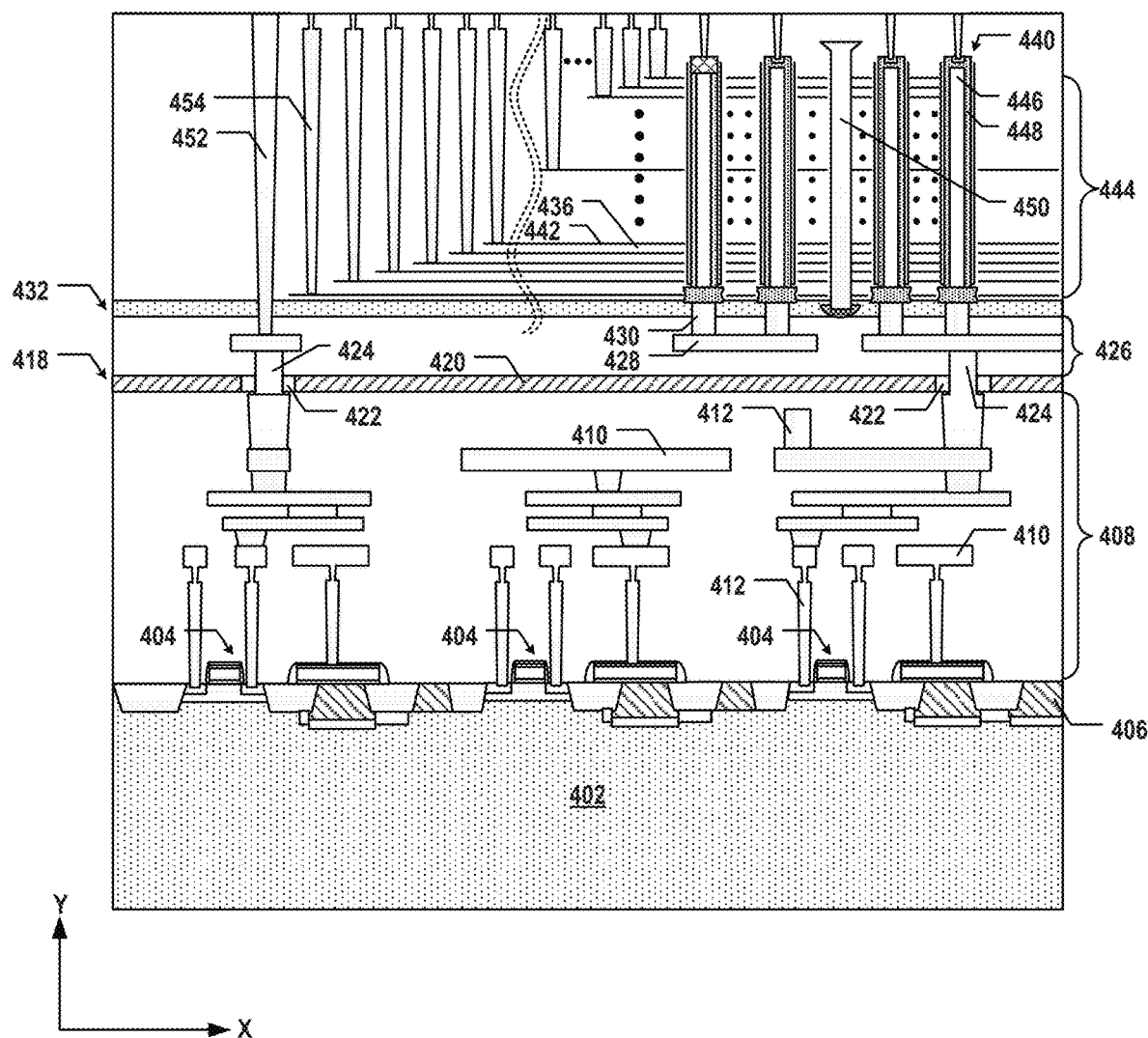

As illustrated in FIG. 4G, NAND memory strings 440 are formed above silicon layer 432. Each first dielectric layer 434 of alternating dielectric stack 438 can be replaced by a conductor layer 442, thereby forming a plurality of conductor/dielectric layer pairs in an alternating conductor/dielectric stack 444. The replacement of first dielectric layers 434 with conductor layers 442 can be performed by wet/dry etch of first dielectric layers 434 selective to second dielectric layers 436 and filling the structure with conductor layers 442. Conductor layers 442 can include conductor materials including, but not limited to, W, Co, Cu, Al, doped silicon, polysilicon, silicides, or any combination thereof. Conductor layers 442 can be filled by thin film deposition processes, such as CVD, ALD, any other suitable process, or any combination thereof. NAND memory strings 440 can each extend vertically through alternating conductor/dielectric stack 444. In some embodiments, conductor layers 442 in alternating conductor/dielectric stack 444 are used to form the select gates and word lines for NAND memory strings 440. At least some of conductor layers 442 in alternating conductor/dielectric stack 444 (e.g., except the top and bottom conductor layers 442) can each be used as word lines of NAND memory strings 440.

In some embodiments, fabrication processes to form NAND memory string 440 further include forming a semiconductor channel 446 that extends vertically through alternating conductor/dielectric stack 444. In some embodiments, fabrication processes to form NAND memory string 440 further include forming a dielectric layer 448 (memory film) between semiconductor channel 446 and the plurality of conductor/dielectric layer pairs in alternating conductor/dielectric stack 444. Dielectric layer 448 can be a composite dielectric layer, such as a combination of multiple dielectric layers including, but not limited to, a tunneling layer, a storage layer, and a blocking layer.

The tunneling layer can include dielectric materials including, but not limited to, silicon oxide, silicon nitride, silicon oxynitride, or any combination thereof. The storage layer can include materials for storing charge for memory operation. The storage layer materials can include, but not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon oxynitride/silicon oxide (ONO). The blocking layer can further include a high-k dielectric layer, such as an $Al_2O_3$ layer. Semiconductor channel 446 and dielectric layer 448 can be formed by processes such as ALD, CVD, PVD, any other suitable processes, or any combination thereof.

As illustrated in FIG. 4G, a GLS 450 that extends vertically through alternating conductor/dielectric stack 444 can be formed above silicon layer 432. GLS 450 can include dielectric materials including, but not limited to, silicon oxide, silicon nitride, silicon oxynitride, or any combination thereof. GLS 450 can be formed by a dry/wet etch process to form a vertical opening through alternating conductor/dielectric stack 444, followed by a fill process to fill the opening with dielectric materials. The opening can be filled by CVD, PVD, ALD, any other suitable processes, or any combination thereof.

As illustrated in FIG. 4G, a TAC 452 is formed on silicon layer 432. TAC 452 can extend vertically through alternating conductor/dielectric stack 444. In some embodiments, the lower end of TAC 452 is formed in contact with lower array interconnect layer 426. In some embodiments, fabrication processes to form TAC 452 include forming a vertical opening through alternating conductor/dielectric stack 444 by a dry/wet etch process, followed by filling the opening with conductor materials and other materials (e.g., dielectric materials) for isolation purposes. TAC 452 can include conductor materials including, but not limited to, W, Co, Cu, Al, doped silicon, silicides, or any combination thereof. The opening of TAC 452 can be filled with conductor materials and other materials by ALD, CVD, PVD, electroplating, any other suitable processes, or any combination thereof.

As illustrated in FIG. 4G, word line via contacts 454 are formed above silicon layer 432. Each word line via contact 454 can extend vertically through a dielectric layer. In some embodiments, the lower end of word line via contact 454 lands on a word line of NAND memory strings 440 (e.g., conductor layer 442), such that each word line via contact 454 is electrically connected to corresponding conductor layer 442. In some embodiments, fabrication processes to form word line via contacts 454 include forming a vertical opening using a dry/wet etch process, followed by filling the opening with conductor materials and other materials (e.g., a barrier layer, an adhesion layer, and/or a seed layer) for conductor filling, adhesion, and/or other purposes. Word line via contacts 454 can include conductor materials including, but not limited to, W, Co, Cu, Al, doped silicon, silicides, or any combination thereof. The openings of word line via contacts 454 can be filled with conductor materials and other materials by ALD, CVD, PVD, electroplating, any other suitable processes, or any combination thereof.

Figure 4H:
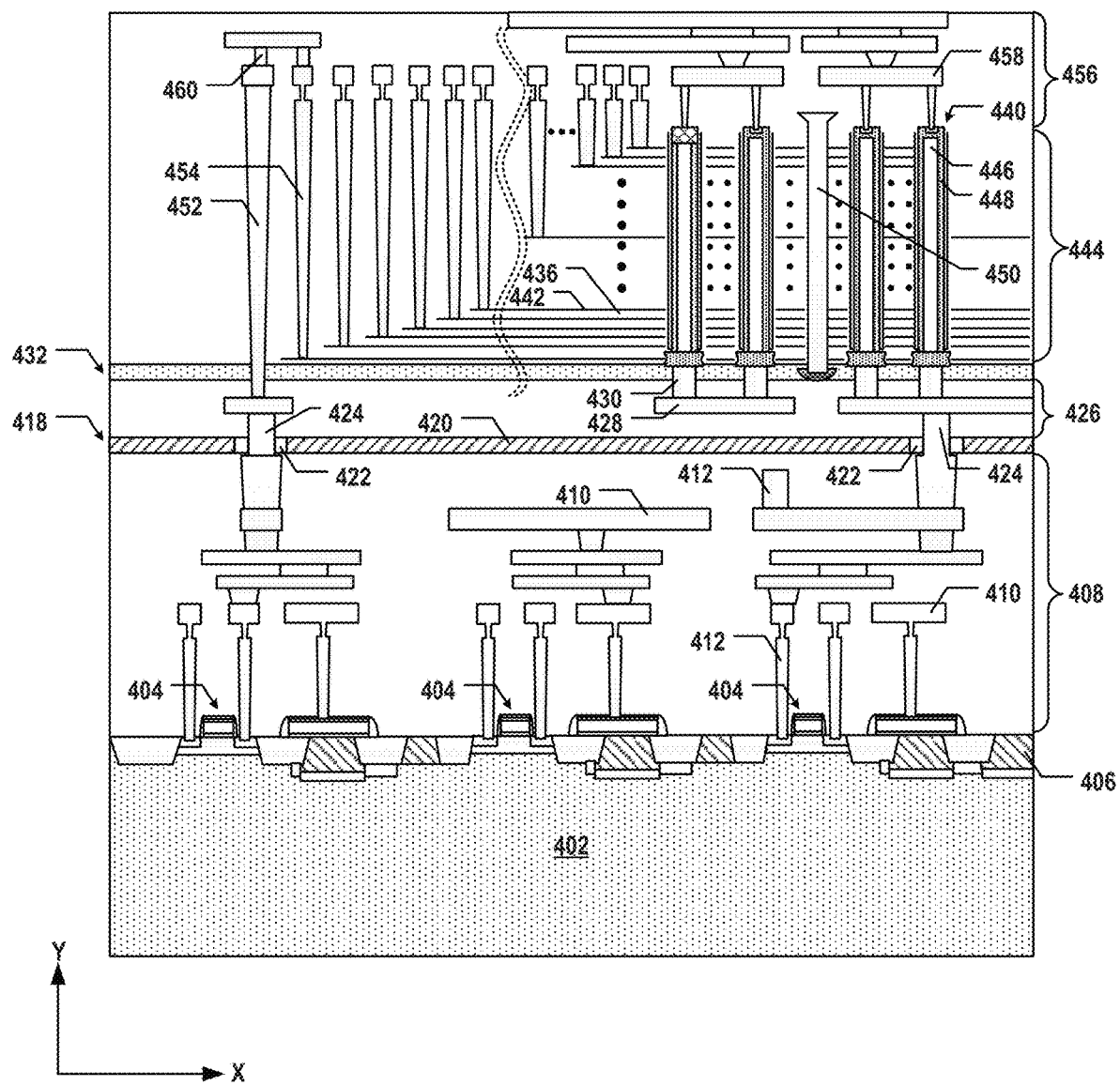

As illustrated in FIG. 4H, an upper array interconnect layer 456 can be formed above alternating conductor/dielectric stack 444 and NAND memory strings 440. Upper array interconnect layer 456 can include interconnects, including interconnect lines 458 and via contacts 460 in one or more ILD layers as the BEOL interconnects of the 3D memory device for transferring electrical signals between the 3D memory device and peripheral circuits.

In some embodiments, upper array interconnect layer 456 includes multiple ILD layers and interconnects therein formed in multiple processes. For example, interconnect lines 458 and via contacts 460 can include conductor materials deposited by one or more thin film deposition processes including, but not limited to, CVD, PVD, ALD, electroplating, electroless plating, or any combination thereof. Fabrication processes to form interconnect lines 458 and via contacts 460 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 4H can be collectively referred to as an "interconnect layer" (e.g., upper array interconnect layer 456).

FIGS. 6A-6G illustrate a fabrication process for forming another exemplary 3D memory device having a shielding layer, according to some embodiments of the present disclosure. FIG. 7 is a flowchart of a method 700 for forming another exemplary 3D memory device having a shielding layer, according to some embodiments. Examples of the 3D memory device depicted in FIGS. 6A-6G and FIG. 7 include 3D memory device 101 depicted in FIG. 1B. FIGS. 6A-6G and FIG. 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7. It is further understood that the details of similar structures (e.g., materials, fabrication process, etc.) in both 3D memory devices formed by methods 500 and 700 may not be repeated below.

Referring to FIG. 7, method 700 starts at operation 702, in which a plurality of memory strings each extending vertically on a substrate are formed. To form the memory strings, an alternating conductor/dielectric stack can be formed on the substrate, and each memory string can be formed to extend vertically through the alternating conductor/dielectric stack.

Figure 6A:
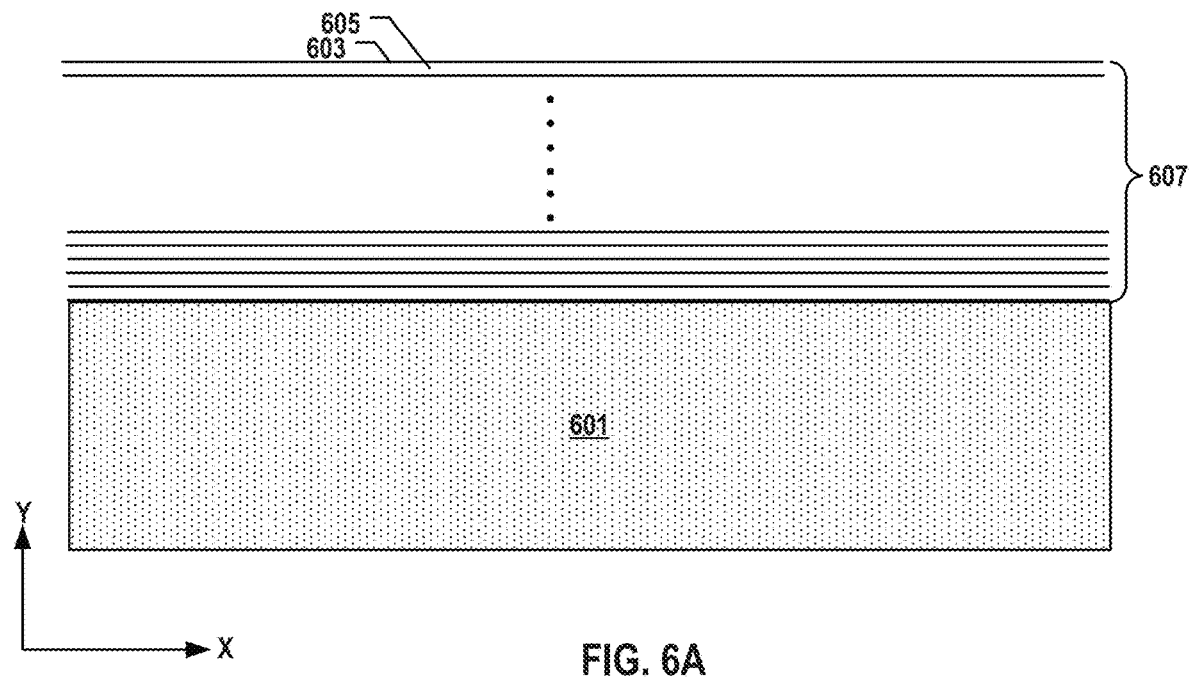
FIGS. 6A-6G illustrate a fabrication process for forming another exemplary 3D memory device having a shielding layer, according to some embodiments.
Figure 7:
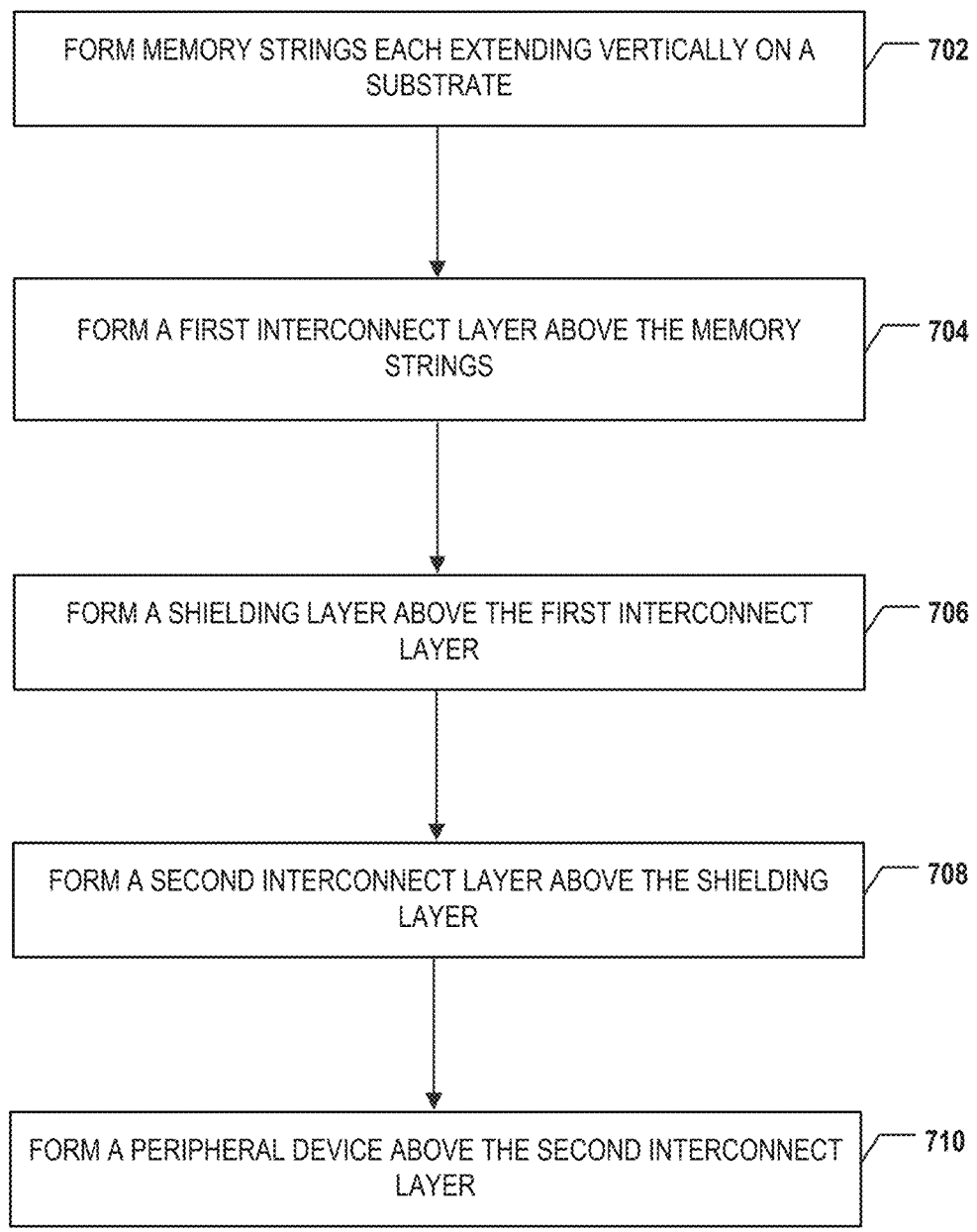
FIG. 7 is a flowchart of a method for forming another exemplary 3D memory device having a shielding layer, according to some embodiments.

As illustrated in FIG. 6A, pairs of first dielectric layer 603 and second dielectric layer 605 (referred to herein as "dielectric layer pairs") are formed on a silicon substrate 601. The plurality of dielectric layer pairs can form an alternating dielectric stack 607. In some embodiments, each dielectric layer pair includes a layer of silicon nitride and a layer of silicon oxide formed by one or more thin film deposition processes.

Figure 6B:
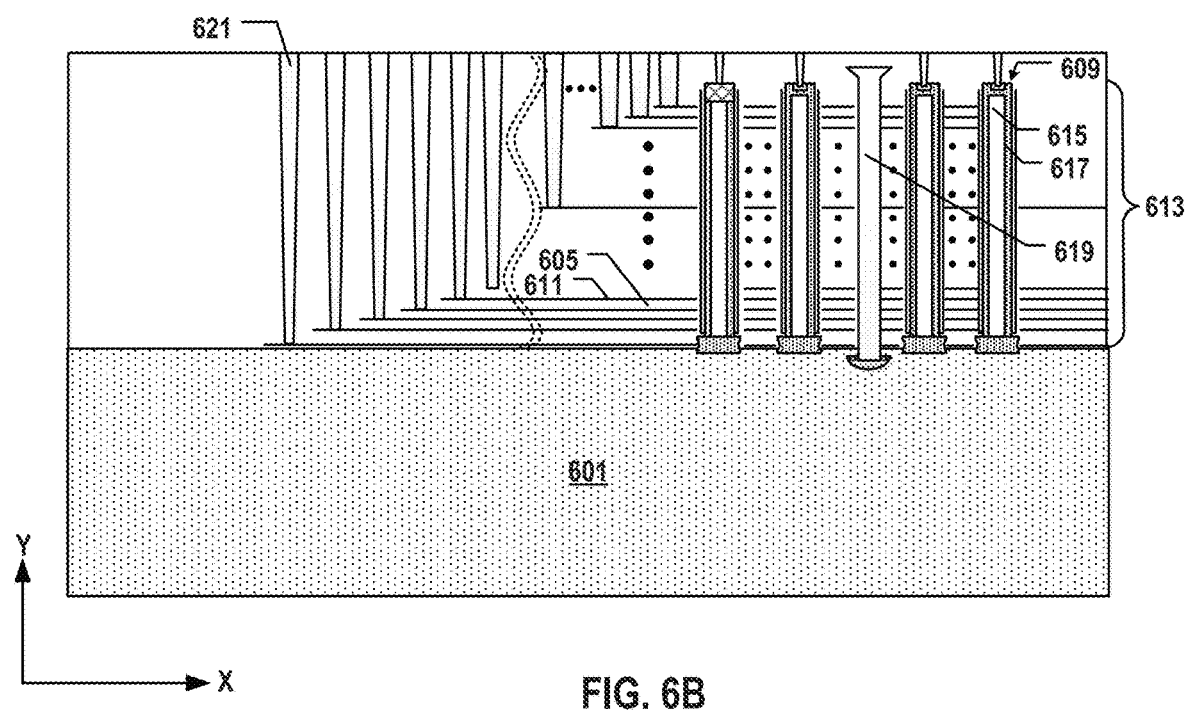

As illustrated in FIG. 6B, NAND memory strings 609 are formed on silicon substrate 601 and extend vertically through an alternating conductor/dielectric stack 613. Each first dielectric layer 603 of alternating dielectric stack 607 can be replaced by a conductor layer 611, thereby forming a plurality of conductor/dielectric layer pairs in alternating conductor/dielectric stack 613. The replacement of first dielectric layers 603 with conductor layers 611 can be performed by wet/dry etch of first dielectric layers 603 selective to second dielectric layers 605 and filling the structure with conductor layers 611. Conductor layers 611 can include conductor materials filled by thin film deposition processes. In some embodiments, fabrication processes to form NAND memory string 609 further include forming a semiconductor channel 615 that extends vertically through alternating conductor/dielectric stack 613 and a dielectric layer 617 (memory film) between semiconductor channel 615 and the plurality of conductor/dielectric layer pairs in alternating conductor/dielectric stack 613. Dielectric layer 617 can be a composite dielectric layer, such as a combination of multiple dielectric layers including, but not limited to, a tunneling layer, a storage layer, and a blocking layer.

As illustrated in FIG. 6B, a GLS 619 that extends vertically through alternating conductor/dielectric stack 613 can be formed on silicon substrate 601. GLS 619 can include dielectric materials and can be formed by a dry/wet etch process to form a vertical opening through alternating conductor/dielectric stack 613, followed by a fill process to fill the opening with the dielectric materials. Word line via contacts 621 can be also formed on silicon substrate 601. In some embodiments, fabrication processes to form word line via contacts 621 include forming a vertical opening using a dry/wet etch process, followed by filling the opening with conductor materials and other materials (e.g., a barrier layer, an adhesion layer, and/or a seed layer) for conductor filling, adhesion, and/or other purposes.

Figure 6C:
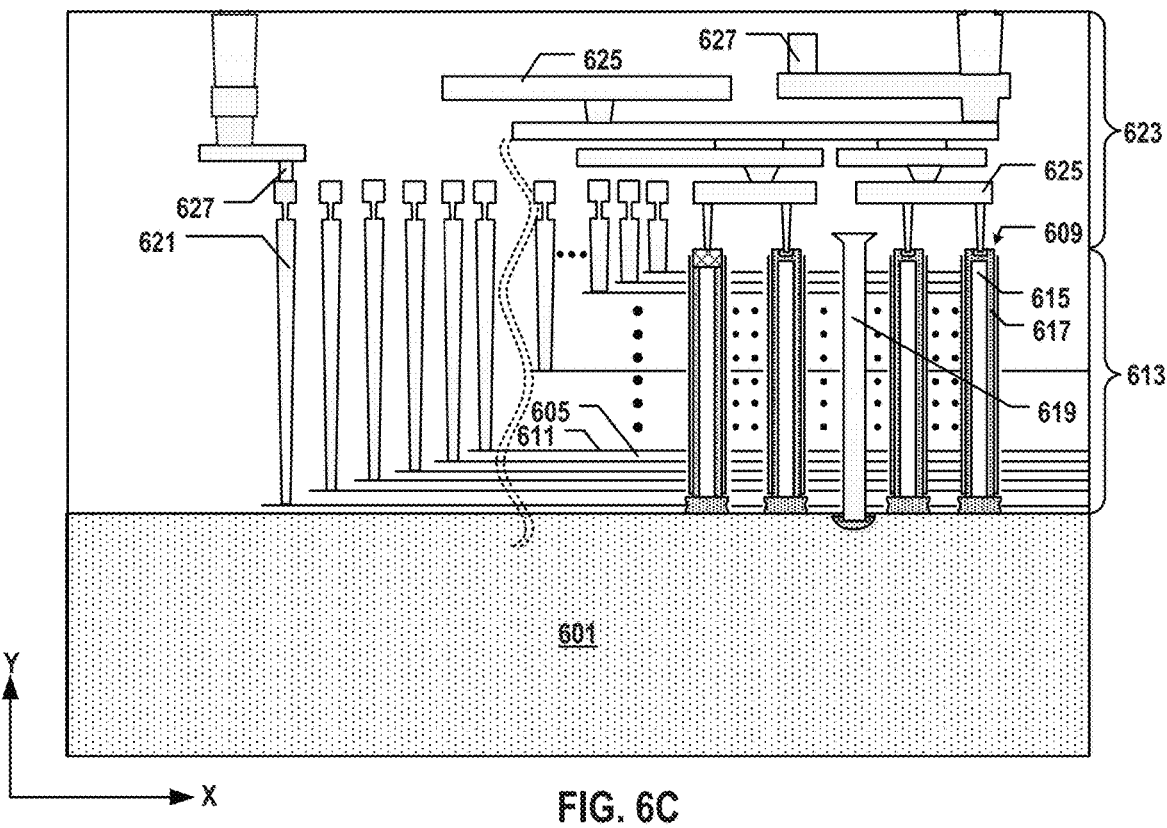

Method 700 proceeds to operation 704, as illustrated in FIG. 7, in which a first interconnect layer (e.g., an array interconnect layer) is formed above the memory strings. The first interconnect layer can include a first plurality of interconnects in one or more ILD layers. As illustrated in FIG. 6C, an array interconnect layer 623 can be formed above NAND memory strings 609. Array interconnect layer 623 can include interconnects, including interconnect lines 625 and via contacts 627 of MEOL and/or BEOL in multiple ILD layers, to make electrical connections with NAND memory strings 609. Interconnect lines 625 and via contacts 627 can include conductor materials deposited by one or more thin film deposition processes.

Method 700 proceeds to operation 706, as illustrated in FIG. 7, in which a shielding layer is formed above the first interconnect layer (e.g., the array interconnect layer). Operation 706 can include forming a conduction region and an isolation region above the first interconnect layer. The conduction region can cover the area of the interconnects in the first interconnect layer. In some embodiments, the conduction region of the shielding layer covers substantially the area of the substrate. Method 700 can further include additional operation(s) to form a contact (e.g., a via contact) extending vertically through the shielding layer and in contact with the interconnects of the first interconnect layer. The contact can be electrically isolated from the conduction region in the shielding layer by the isolation region.

Figure 6D:
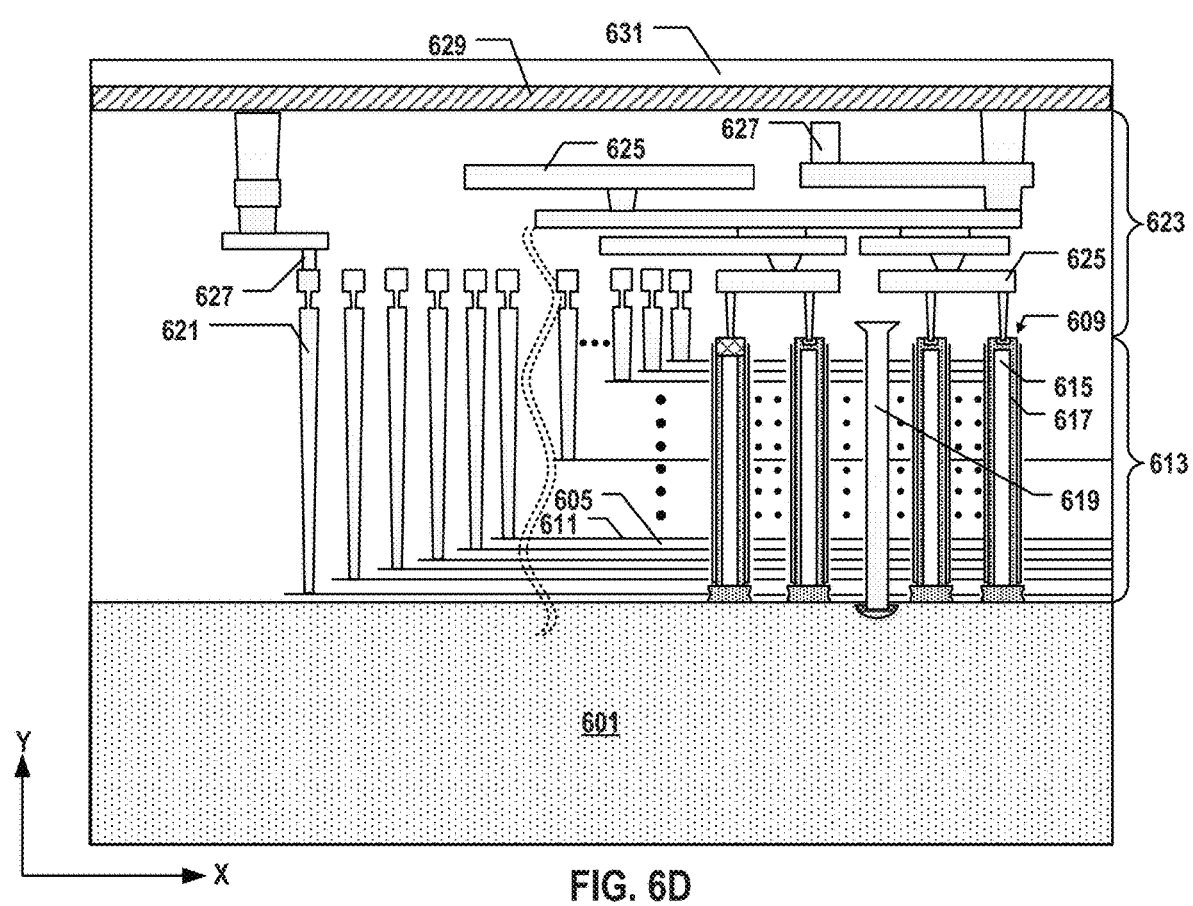

As illustrated in FIG. 6D, a conductive film 629 can be formed on the top surface of array interconnect layer 623. The conductive materials in conductive film 629 can include, but not limited to, metals, metal alloys, metal silicides, and doped semiconductors, formed by one or more thin film deposition processes. In some embodiments, deposited conductive film 629 has a thickness between about 1 nm and about 1 µm, such as between 1 nm and 1 µm. In some embodiments, deposited conductive film 629 has a thickness between about 1 µm and about 20 µm, such as between 1 µm and 20 µm. A dielectric film 631 can be formed on conductive film 629. Dielectric film 631 can include dielectric materials formed by thermal growth and/or one or more thin film deposition processes.

Figure 6E:
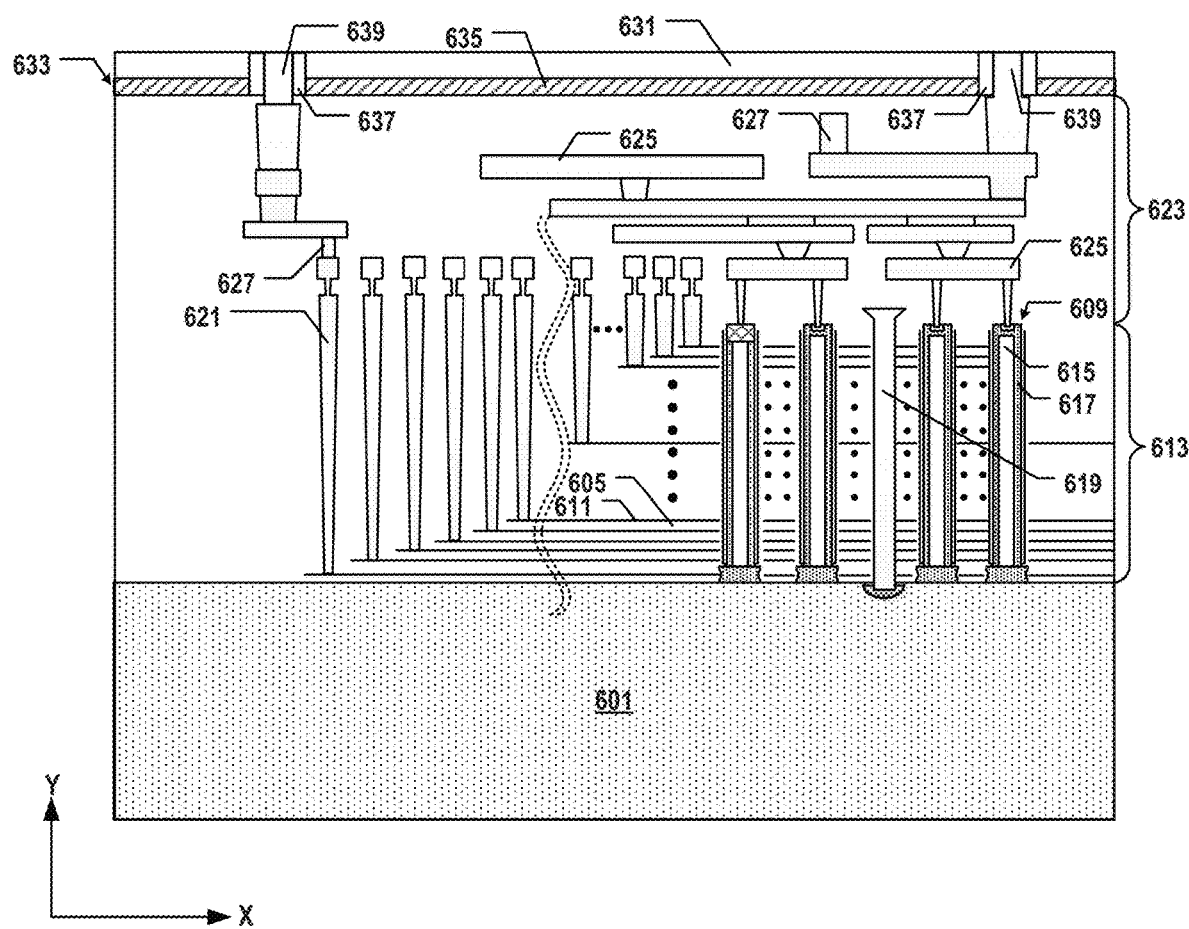

As illustrated in FIG. 6E, conductive film 629 can be patterned to form a shielding layer 633 having a conduction region 635 and one or more isolation regions 637. In some embodiments, conductive film 629 is patterned to form isolation regions 637, and the remaining conductive materials in conductive film 629 become conduction region 635. Patterning process (e.g., photolithography and dry/wet etch) can be used for patterning isolation regions 637 in shielding layer 633. Isolation regions 637 can then be formed by thermal growth and/or thin film deposition of dielectric materials in the patterned region. Shielding layer 633 can be patterned to form any suitable layout in different arrangements as described above with respect to FIG. 2 and FIGS. 3A-3B.

As illustrated in FIG. 6E, one or more via contacts 639 can be formed through dielectric film 631 and shielding layer 633 and in contact with interconnects 625 and 627 in array interconnect layer 623. Via contacts 639 can be electrically isolated from conduction region 635 of shielding layer 633 by isolation regions 637. In some embodiments, via contacts 639 are formed by first patterning via holes through dielectric film 631 and shielding layer 633 using patterning processes. The via holes can be filled with a conductor, a barrier layer, an adhesion layer, and/or a seed layer.

Method 700 proceeds to operation 708, as illustrated in FIG. 7, in which a second interconnect layer (e.g., a lower peripheral interconnect layer) is formed above the shielding layer. The second interconnect layer can include a second plurality of interconnects in one or more ILD layers. The conduction region of the shielding layer formed at operation 706 can cover the area of the interconnects in the second interconnect layer as well. That is, the conduction region of the shielding layer can cover the area of both the first and second interconnects in the first and second interconnect layers. A semiconductor layer (e.g., a silicon layer) can be formed above the second interconnect layer.

Figure 6F:
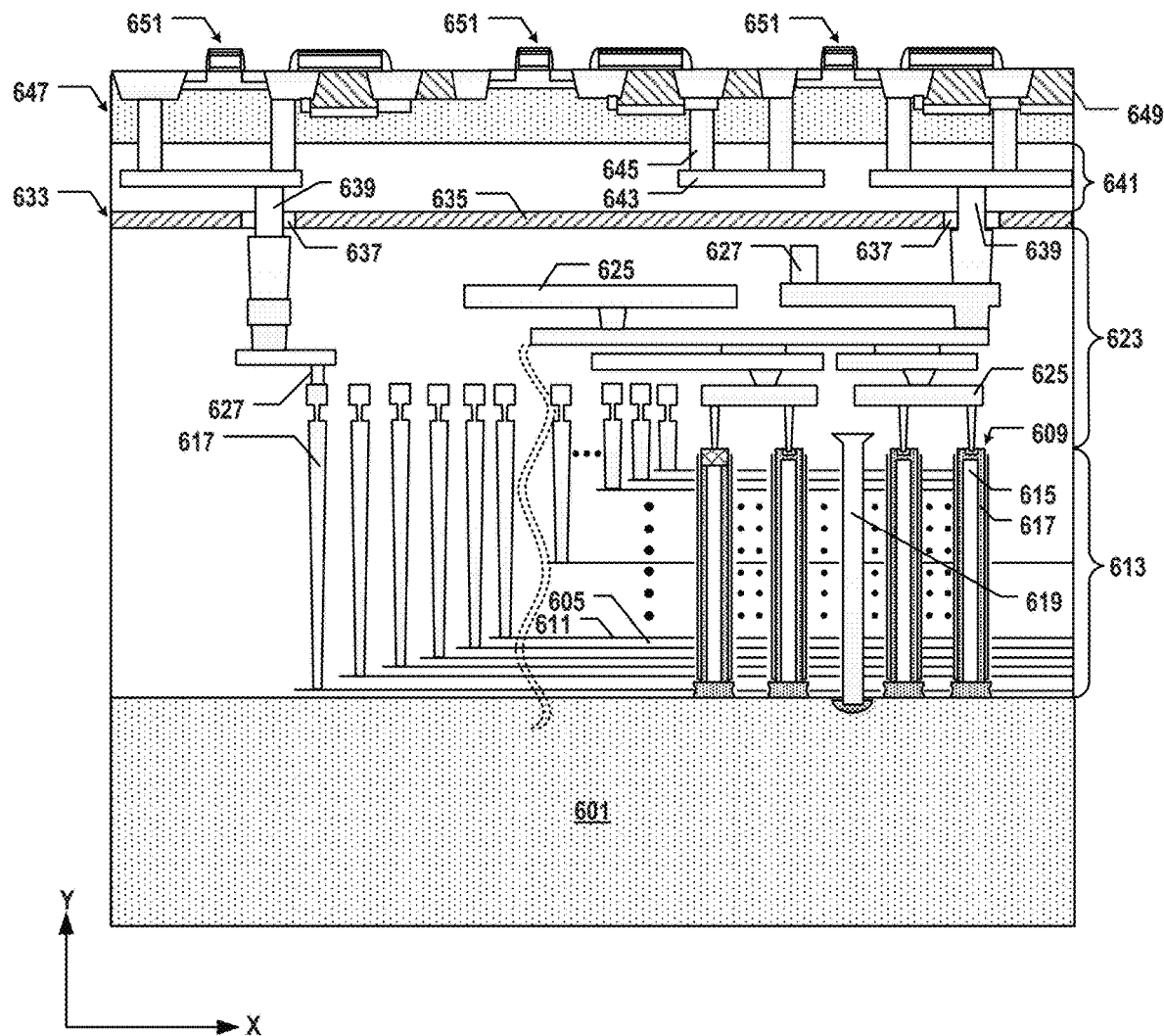

As illustrated in FIG. 6F, a lower peripheral interconnect layer 641 can be formed above shielding layer 633. Lower peripheral interconnect layer 641 can include interconnects, including interconnect lines 643 and via contacts 645 in one or more ILD layers for backside metal routing. In some embodiments, lower peripheral interconnect layer 641 includes multiple ILD layers (e.g., including dielectric film 631 in FIG. 6E) and interconnects therein formed in multiple processes. Interconnect lines 643 and via contacts 645 can include conductor materials deposited by one or more thin film deposition processes.

As illustrated in FIG. 6F, a silicon layer 647 can be formed above lower peripheral interconnect layer 641. Silicon layer 647 can include polysilicon or amorphous silicon deposited by one or more thin film deposition processes. Doped regions (e.g., wells) in silicon layer 647 can be formed by ion implantation and/or thermal diffusion of dopants at desired doping concentrations. Isolation regions 649 (e.g., STIs) can also be formed in silicon layer 647 by wet/dry etch and thin film deposition.

Method 700 proceeds to operation 710, as illustrated in FIG. 7, in which a peripheral device is formed above the second interconnect layer (and the semiconductor layer). A third interconnect layer (e.g., an upper peripheral interconnect layer) can be formed above the peripheral device. In some embodiments, a contact (e.g., a via contact) extending vertically through the semiconductor layer is formed and in contact with the second interconnect layer (e.g., the lower peripheral interconnect layer), so that the first interconnect layer (e.g., the array interconnect layer) is electrically connected to the third interconnect layer (e.g., the upper peripheral interconnect layer).

Figure 6G:
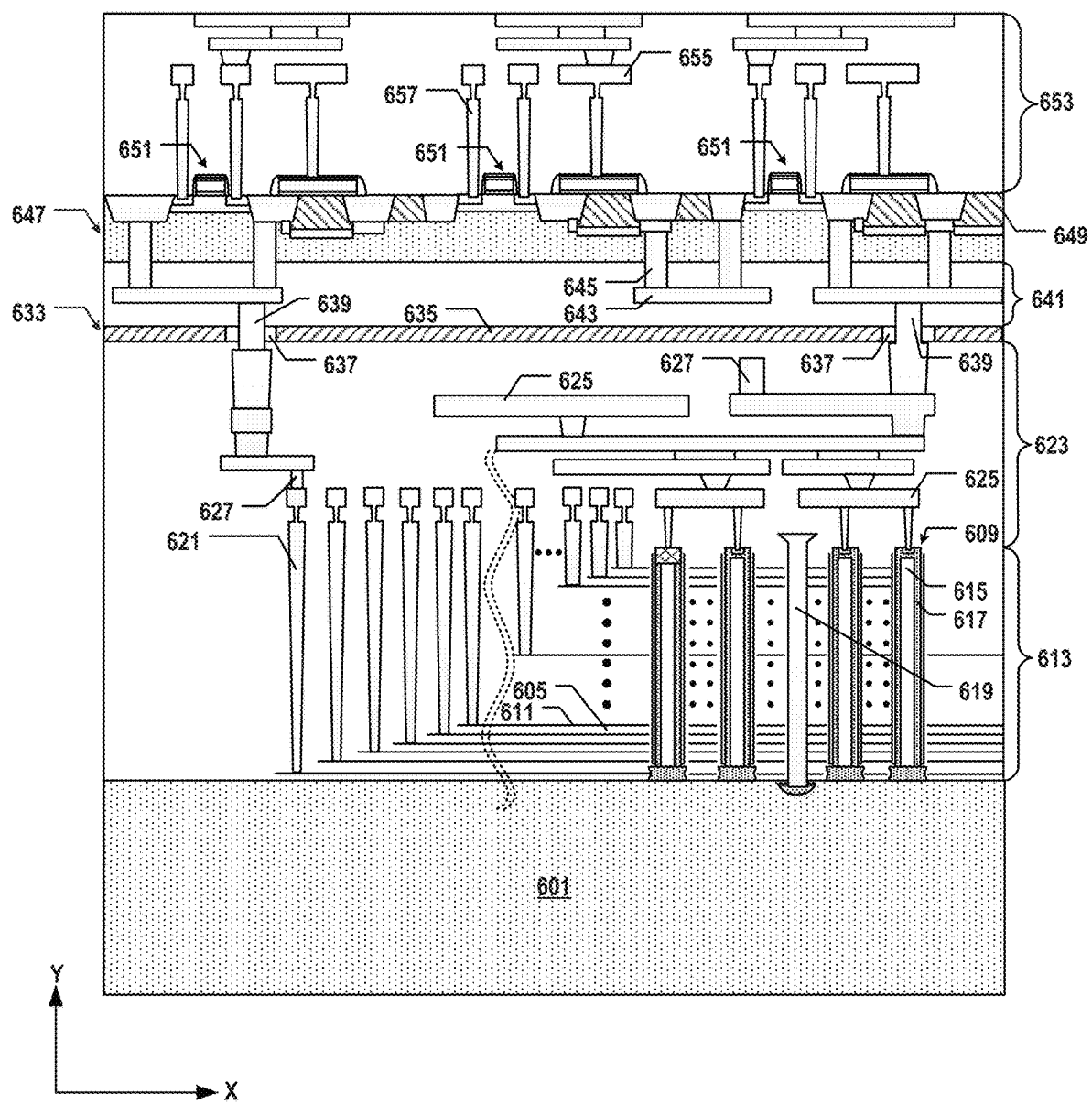

As illustrated in FIG. 6G, a peripheral device is formed on silicon layer 647. The peripheral device can include a plurality of transistors 651 formed on silicon layer 647. An upper peripheral interconnect layer 653 can be formed above transistors 651. Upper peripheral interconnect layer 653 can include interconnects, including interconnect lines 655 and via contacts 657 in one or more ILD layers as the BEOL interconnects of the 3D memory device for transferring electrical signals between the 3D memory device and peripheral circuits. In some embodiments, upper peripheral interconnect layer 653 includes multiple ILD layers and interconnects therein formed in multiple processes. For example, interconnect lines 655 and via contacts 657 can include conductor materials deposited by one or more thin film deposition processes.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming a peripheral device on a substrate;
   forming a first interconnect layer comprising a first plurality of interconnects above the peripheral device;
   forming a shielding layer comprising a conduction region above the first interconnect layer;
   after forming the shielding layer, forming a second interconnect layer comprising a second plurality of interconnects above the shielding layer, wherein the conduction region of the shielding layer covers an area of the first and second plurality of interconnects in the first and second interconnect layers; and
   after forming the second interconnect layer, forming a plurality of memory strings each extending vertically above the second interconnect layer,
   wherein the conduction region of the shielding layer is connected to a grounding voltage.

2. The method of claim 1, further comprising forming a first contact extending vertically through the shielding layer and in contact with the first interconnect layer and the second interconnect layer.

3. The method of claim 2, wherein forming the shielding layer comprises forming an isolation region in the shield layer to electrically isolate the conduction region and the first contact.

4. The method of claim 2, further comprising:
   forming a semiconductor layer above the second interconnect layer;
   forming an alternating conductor/dielectric stack on the semiconductor layer, wherein each of the plurality of memory strings extends vertically through the alternating conductor/dielectric stack; and
   forming a third interconnect layer above the alternating conductor/dielectric stack.

5. The method of claim 4, further comprising forming a second contact extending vertically through the alternating conductor/dielectric stack and the semiconductor layer and in contact with the second interconnect layer, so that the first interconnect layer is electrically connected to the third interconnect layer.

6. The method of claim 1, wherein the conduction region of the shielding layer covers substantially an area of the substrate.

7. A method for forming a three-dimensional (3D) memory device, comprising:
   forming a plurality of memory strings each extending vertically on a substrate;
   after forming the plurality of memory strings, forming a first interconnect layer comprising a first plurality of interconnects above the plurality of memory strings;
   after forming the first interconnect layer, forming a shielding layer comprising a conduction region above the first interconnect layer;
   forming a second interconnect layer comprising a second plurality of interconnects above the shielding layer, wherein the conduction region of the shielding layer covers an area of the first and second plurality of interconnects in the first and second interconnect layers; and
   forming a peripheral device above the second interconnect layer,
   wherein the conduction region of the shielding layer is connected to a grounding voltage.

8. The method of claim 7, further comprising forming a first contact extending vertically through the shielding layer and in contact with the first interconnect layer and the second interconnect layer.

9. The method of claim 8, wherein forming the shielding layer comprises forming an isolation region in the shield layer to electrically isolate the conduction region and the first contact.

10. The method of claim 8, further comprising:
    forming an alternating conductor/dielectric stack on the substrate, wherein each of the plurality of memory strings extends vertically through the alternating conductor/dielectric stack; and
    forming a third interconnect layer above the peripheral device.

11. The method of claim 10, further comprising:
    forming a semiconductor layer above the second interconnect layer; and
    forming a second contact extending vertically through the semiconductor layer and in contact with the second interconnect layer, so that the first interconnect layer is electrically connected to the third interconnect layer.

12. The method of claim 7, wherein the conduction region of the shielding layer covers substantially an area of the substrate.

13. The method of claim 4, wherein the first contact is formed before forming the alternating conductor/dielectric stack.

14. The method of claim 4, further comprising:
    forming a slit structure extending vertically through the alternating conductor/dielectric stack above the semiconductor layer.

15. The method of claim 5, wherein the first contact is formed before forming the alternating conductor/dielectric stack and the second contact is formed after forming the alternating conductor/dielectric stack.

16. The method of claim 8, wherein the first contact is formed before forming the peripheral device.

17. The method of claim 11, wherein the first contact is formed before forming the semiconductor layer and the second contact is formed after forming the semiconductor layer.

18. The method of claim 1, wherein the second interconnect layer is disposed between the plurality of memory strings and the shielding layer.

19. The method of claim 1, wherein the conduction region of the shielding layer is connected to the grounding voltage to reduce a coupling effect between the first interconnect layer and the second interconnect layer.

20. The method of claim 7, wherein the first interconnect layer is disposed between the plurality of memory strings and the shielding layer.

* * * * *